United States Patent
Ogihara et al.

(10) Patent No.: US 7,847,298 B2
(45) Date of Patent: Dec. 7, 2010

(54) SEMICONDUCTOR COMPOSITE APPARATUS, LED, LED PRINTHEAD, AND IMAGE FORMING APPARATUS

(75) Inventors: Mitsuhiko Ogihara, Takasaki (JP); Masataka Muto, Takasaki (JP); Tomoki Igari, Takasaki (JP); Takahito Suzuki, Takasaki (JP)

(73) Assignee: Oki Data Corporation, Tokyo (JP)

( * ) Notice: Subject to any disclaimer, the term of this patent is extended or adjusted under 35 U.S.C. 154(b) by 0 days.

(21) Appl. No.: 11/363,477

(22) Filed: Feb. 27, 2006

(65) Prior Publication Data

US 2006/0197102 A1    Sep. 7, 2006

(30) Foreign Application Priority Data

Mar. 2, 2005    (JP)    ............................. 2005-057636

(51) Int. Cl.
*H01L 27/15* (2006.01)
(52) U.S. Cl. .............................. 257/79; 257/86; 257/98; 257/E33.067; 257/E33.068
(58) Field of Classification Search .................... 257/79, 257/86, 98, E33.067, E33.068; 438/29, 38
See application file for complete search history.

(56) References Cited

U.S. PATENT DOCUMENTS

| 5,929,474 | A | 7/1999 | Huang et al. |
| 6,107,653 | A * | 8/2000 | Fitzgerald .................... 257/191 |
| 6,338,868 | B1 * | 1/2002 | Shibuya et al. ................ 427/10 |
| 6,455,398 | B1 | 9/2002 | Fonstad, Jr. et al. |
| 6,573,537 | B1 * | 6/2003 | Steigerwald et al. ......... 257/103 |
| 6,897,474 | B2 * | 5/2005 | Brown et al. .................. 257/40 |
| 6,911,666 | B2 * | 6/2005 | Voutsas ........................ 257/40 |
| 6,995,035 | B2 * | 2/2006 | Cok et al. ..................... 438/82 |
| 2003/0015713 | A1 * | 1/2003 | Yoo ............................ 257/79 |
| 2003/0124392 | A1 * | 7/2003 | Bright ......................... 428/698 |
| 2004/0189167 | A1 | 9/2004 | Adachi et al. |
| 2004/0239892 | A1 | 12/2004 | Cok et al. |
| 2005/0040427 | A1 | 2/2005 | Sugawara et al. |
| 2006/0152931 | A1 * | 7/2006 | Holman ....................... 362/297 |
| 2007/0222370 | A1 * | 9/2007 | Zhu et al. .................... 313/504 |

FOREIGN PATENT DOCUMENTS

| EP | 1 471 459 A2 | 10/2004 |
| EP | 1 482 572 A1 | 12/2004 |
| JP | 10-063807 A | 3/1998 |
| WO | 2004075245 A2 | 9/2004 |

OTHER PUBLICATIONS

European Search Report dated Oct. 11, 2006 (5 pages).
European Office Action for the related European Application No. 06110563.1 dated May 12, 2010.

* cited by examiner

*Primary Examiner*—Zandra Smith
*Assistant Examiner*—Paul E Patton
(74) *Attorney, Agent, or Firm*—Panitch Schwarze Belisario & Nadel LLP

(57) ABSTRACT

A semiconductor composite apparatus includes a substrate and a planarizing layer, and a semiconductor thin film. The planarizing layer is formed on the substrate either directly or indirectly. The planarizing layer includes a first surface that faces the substrate, and a second surface that is on the side of the planarizing layer remote from the substrate. The semiconductor thin film formed on the planarizing layer. The second surface has a roughness of not more than 5 nm.

21 Claims, 33 Drawing Sheets

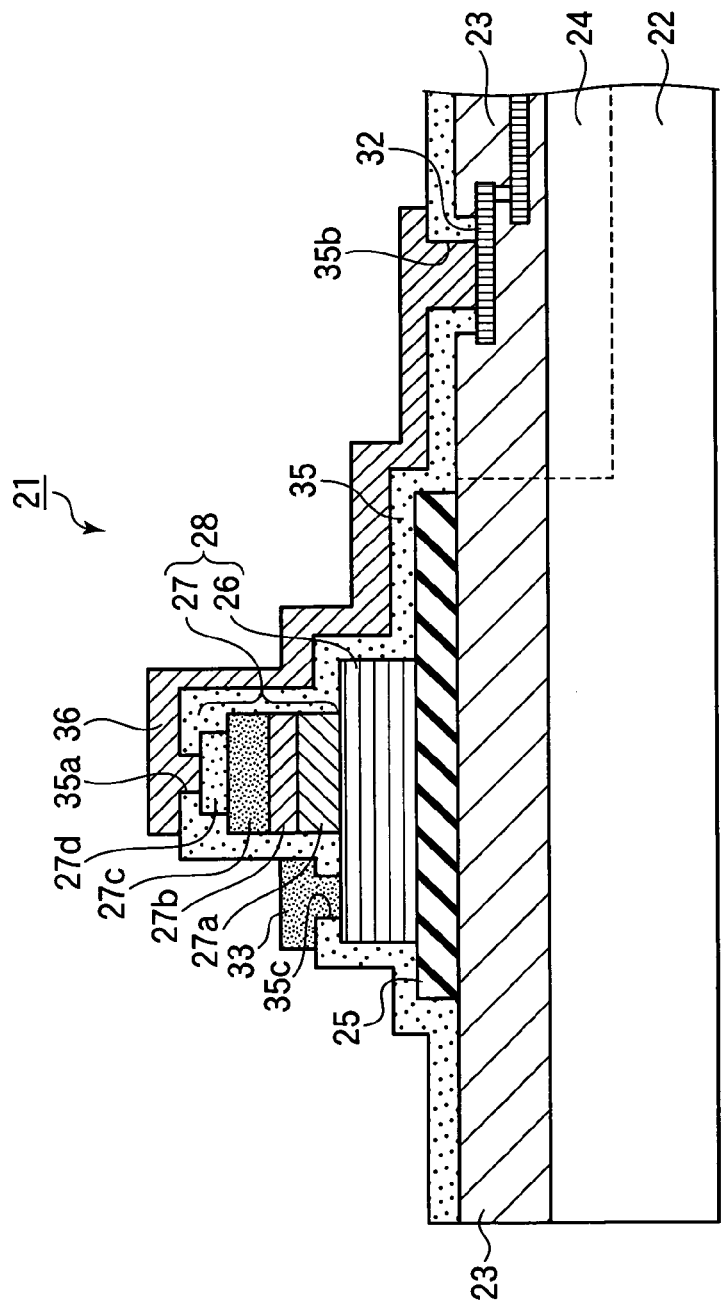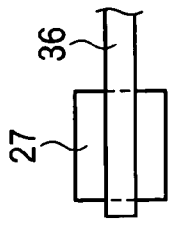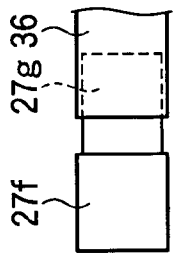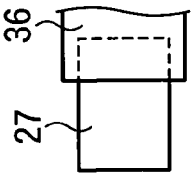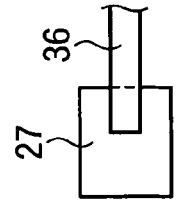

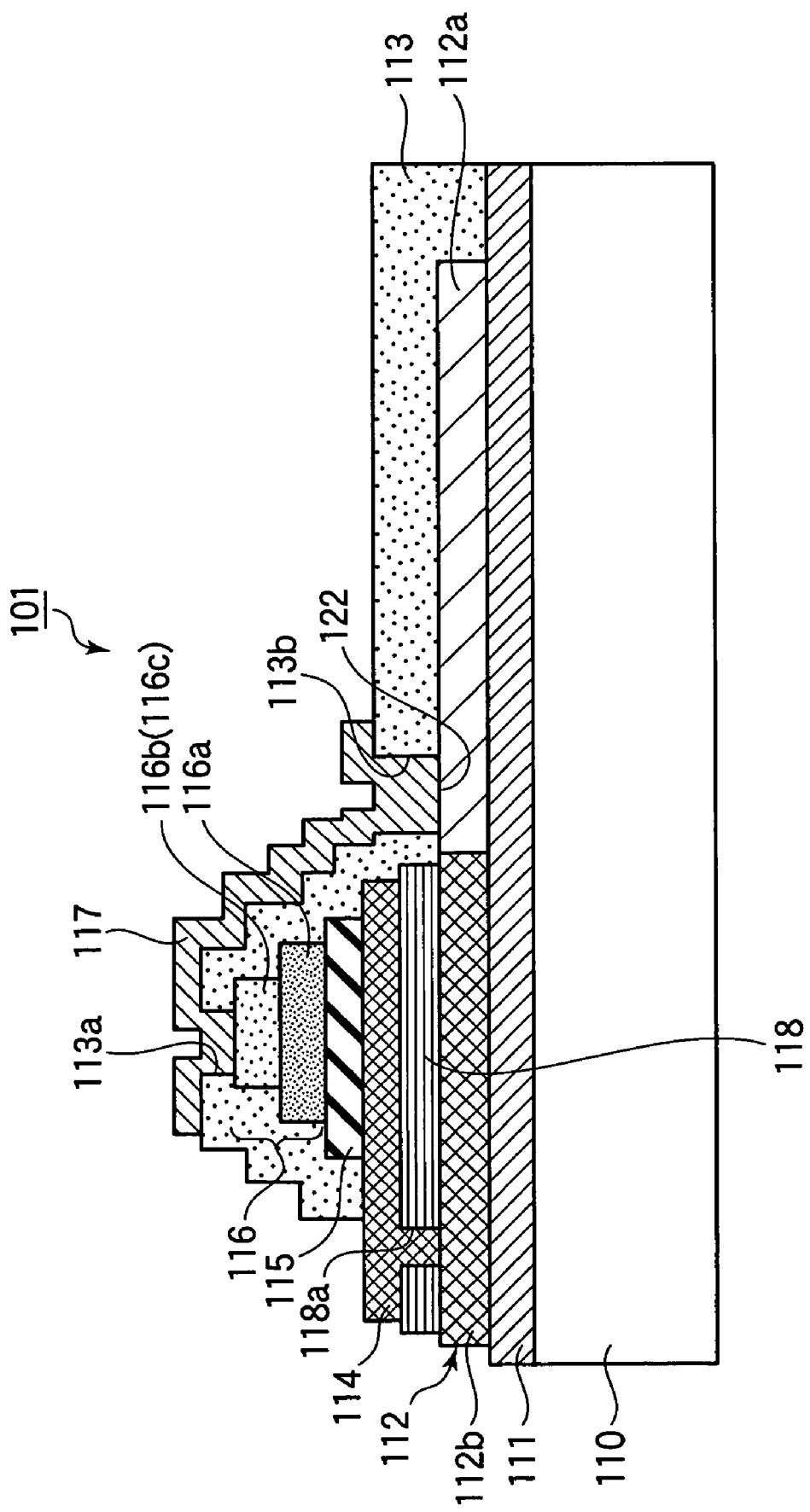

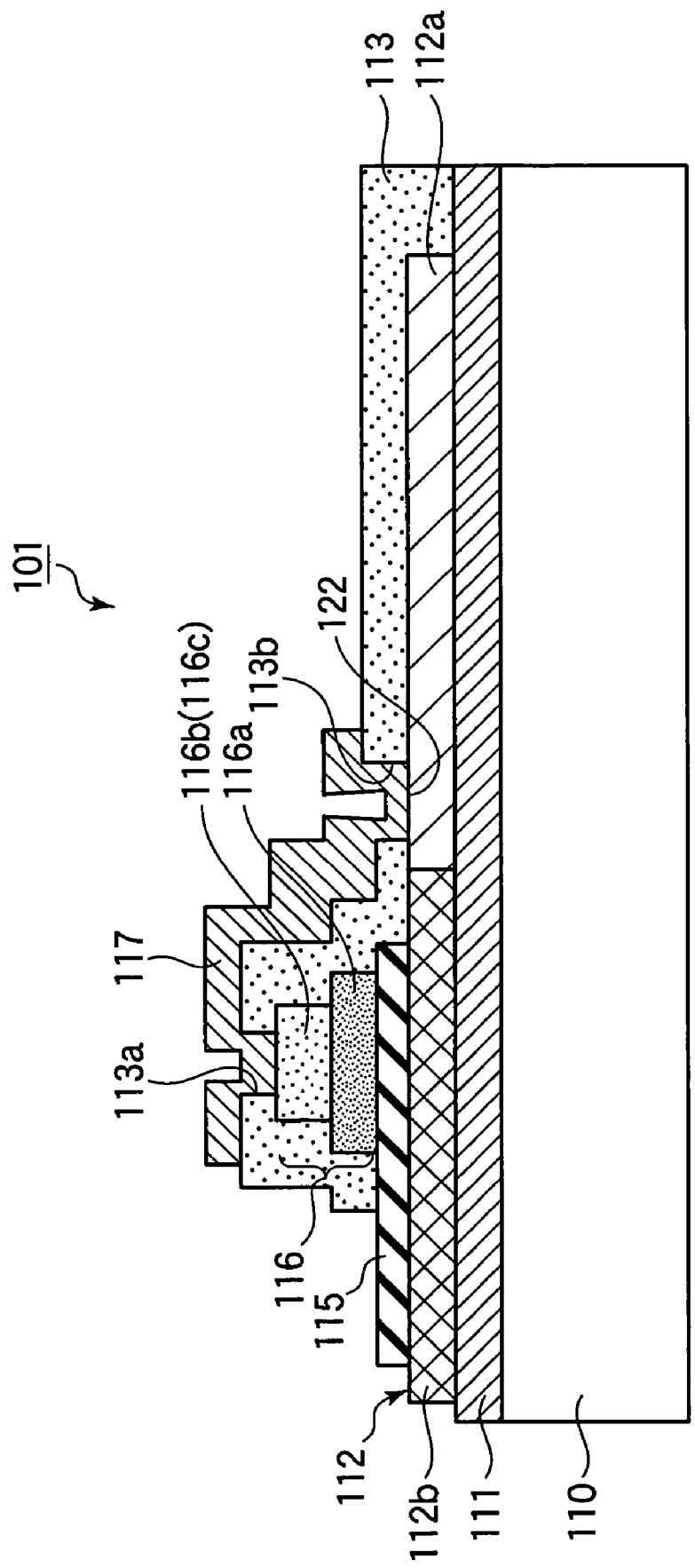

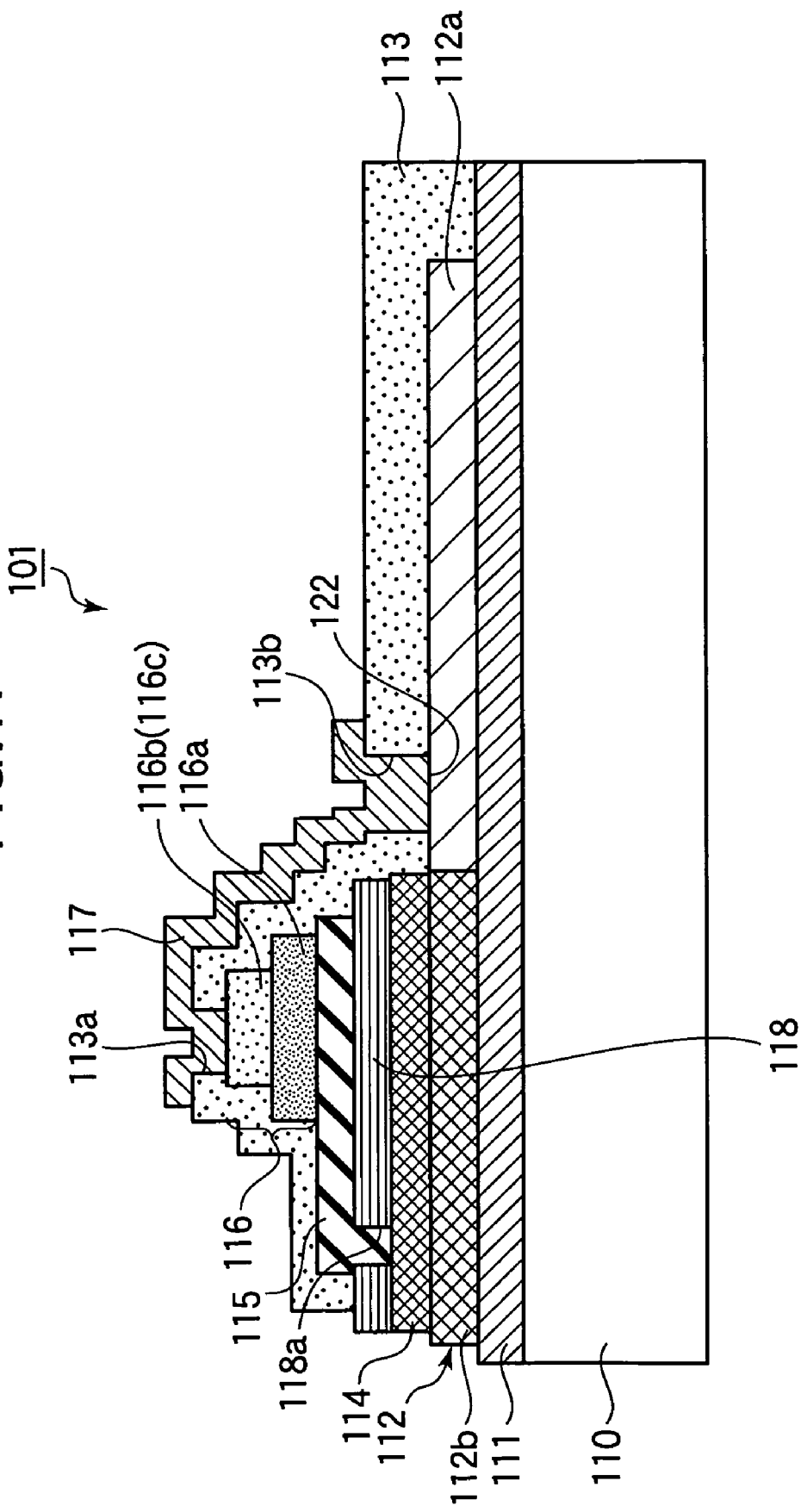

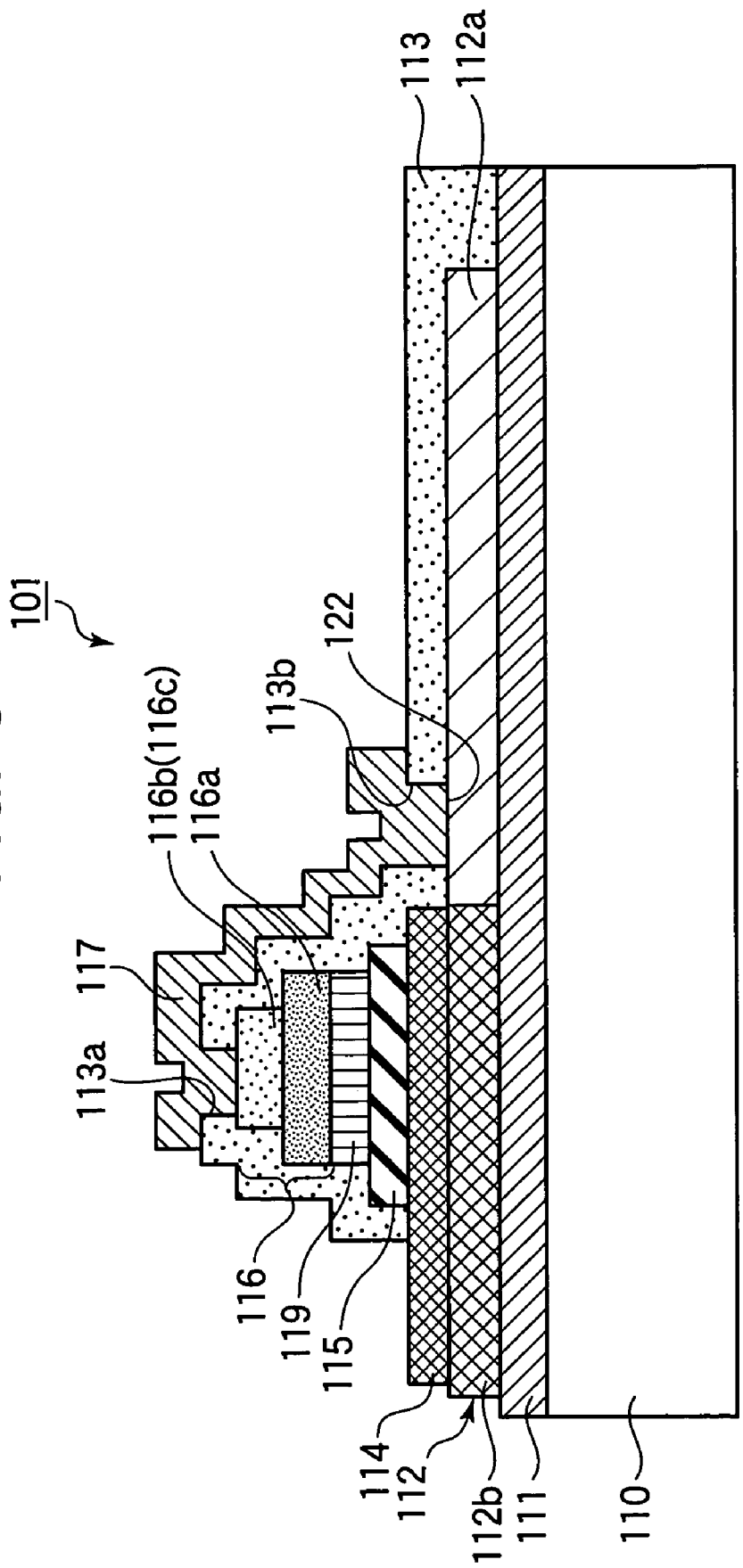

SEMICONDUCTOR COMPOSITE APPARATUS, LED, LED PRINTHEAD, AND IMAGE FORMING APPARATUS

BACKGROUND OF THE INVENTION

1. Field of the Invention

The present invention relates to a semiconductor composite apparatus, an LED that employs the semiconductor composite apparatus, an LED printhead that employs the LED, and an image forming apparatus that incorporates the LED printhead.

2. Description of Related Art

FIG. 33 is a perspective view illustrating a pertinent portion of a conventional LED printhead 500. FIG. 34 is a fragmentary top view of an LED array chip 502. This LED array chip is used in the LED printhead 500 in FIG. 33. The LED array chips 502 and driving IC chips 504 are mounted on a substrate 501. Bonding wires 506 connect between electrode pads 503 of the LED array chips 502 and corresponding electrode pads 505 of the driving IC chips 504.

With the LED printhead 500 in FIGS. 33 and 34, the electrode pads 503 and 505 are used for wire bonding, and have to be relatively large in area, e.g., 100×100 μm. For this reason, the surface areas of the LED array chip 502 and driving IC chip 504 are large. This makes it difficult to reduce the manufacturing cost of the LED array chip 502 and driving IC chip 504.

The LED array chip 502 has a light emitting region 507 having a depth of about 5 μm. There is the possibility that the wires contact the end portions of the IC chips and LED array chips. For reliable bonding, the LED array chip 502 should have substantially the same thickness as the driving IC chip 504 (e.g., 250-300 μm). Wire bonding exerts a large impact on the chips and therefore the thickness of the LED chip cannot be thin. This is another reason why the material cost of the LED array chip 502 cannot be reduced.

Japanese patent (Kokai) No. 10-063807 discloses a technique in which the pads on the light emitting elements may be connected to the pads on the substrate by flip-chip bonding instead of wire bonding. However, flip-chip bonding also requires bonding pads on the light emitting element (i.e., bonding pads having a certain size are required). Thus, use of flip-chip bonding that uses a paste is limited in reduction of material cost.

Another method is to bond a semiconductor such as a thin film light emitting element directly onto a substrate. This method eliminates pads that require a large area. When a semiconductor thin film device is bonded directly onto a substrate without using a paste, the adhesion of the semiconductor thin film to the substrate highly depends on the flatness of the bonding surfaces.

SUMMARY OF THE INVENTION

An object of the invention is to solve the aforementioned drawbacks of the prior art.

Another object of the invention is to provide a semiconductor device in which a thin type semiconductor chip is firmly bonded to a substrate and wiring patterns are provided for making electrical connection between the semiconductor chip and substrate as well as between elements formed on the substrate.

A still another object of the invention is to provide a semiconductor composite device in which the thin type semiconductor device is bonded mechanically reliably to the substrate with good electrical contact.

Yet another object of the invention is to provide a semiconductor composite device of the aforementioned construction, an LED constructed of the semiconductor composite device, an LED printhead incorporating such LEDs, and an image forming apparatus incorporating the LED printhead.

A semiconductor composite apparatus includes a substrate and a planarizing layer, and a semiconductor thin film. The planarizing layer is formed on the substrate either directly or indirectly. The planarizing layer includes a first surface that faces the substrate, and a second surface that is on the side of the planarizing layer remote from the substrate. The second surface has a smaller flatness than the first surface. The semiconductor thin film formed on the planarizing layer.

The second surface has a flatness of not more than 5 nm.

The planarizing layer is formed of an organic compound.

The organic compound contains at least one material selected from the group of polyimide, polycarbonate, polyether imide, polyarylate, polyurethane, polyamide, and polyamide-imide.

The planarizing layer is formed of an oxide.

The oxide is selected from the group of $SiO_2$, PSG, BSG, SOG, and $Al_2O_3$.

The planarizing layer is formed of a nitride.

The nitride is selected from the group of $Si_xN_y$ and $Si_xN_yO_z$.

The semiconductor thin film includes a light emitting element. The planarizing layer is formed of a material transparent to light emitted from the light emitting element. A reflection layer is formed under the planarizing layer, the reflection layer reflecting the light emitted from the light emitting element.

A thin film layer is formed between the planarizing layer and the reflection layer.

The planarizing layer is an electrically conductive film through which current flows.

The semiconductor composite apparatus further comprising an electrically conductive layer that is electrically connected to the planarizing layer.

The electrical conductive layer contains a precious metal or is formed of a precious metal alloy.

The precious metal is Au and the precious metal alloy is an alloy containing Au.

The electrical conductive layer contains Al.

The planarizing layer is formed of a material transparent to light emitted from the light emitting element.

The material transparent to light emitted from the light emitting element is a metal oxide.

The metal oxide is a thin film of indium, indium/tin oxide (ITO), or zinc oxide (ZnO), or an electrically conductive metal oxide that contains an element selected from the group of Cu, Sr, Bi, Ca, Y, and Rb.

The reflection layer is a multi-layer reflection film formed of a dielectric thin film.

The reflection layer is formed of a metal material.

The reflection is a multi-layer reflection film formed of a dielectric thin film and a metal thin film.

The semiconductor thin film is formed of an electrovalent material.

The electrovalent material is a compound semiconductor material.

The semiconductor thin film is a covalent material.

The covalent material is selected from the group of Si, Ge, SiGe, and SiC. The planarizing layer is formed by coating a material.

The coated material is an organic material.

The organic material is photosensitive.

The organic material is selected from the group of polyimide, polycarbonate, polyether imide, polyarylate, polyurethane, polyamide, and polyamide-imide.

The organic material is a polymer having a carbonyl group adjacent to hetero atoms.

The surface roughness of the planarizing layer is equal to or smaller than 50 nm.

The reflection layer is either a single metal layer formed of Ti, Au, Ge Pt, or Ni, a stacked layer formed of a material that contains Ti, Au, Ge Pt, or Ni, composite layer formed Ti, Au, Ge Pt, or Ni, or an alloy of Ti, Au, Ge Pt, or Ni.

The reflection layer is either a single metal layer formed of Cr, Ni, Pd, or Al, a stacked layer formed of a material that contains Cr, Ni, Pd, or Al, a composite layer formed Cr, Ni, Pd, or Al or an alloy of Cr, Ni, Pd, or Al.

The planarizing layer is formed of an organic material and the reflection layer is in contact with the planarizing layer layer, wherein an uppermost layer of the reflection layer is formed of an element selected from the group of Ti, Au, Cr, Ni, and Al.

The surface of the reflection layer in contact with the planarizing layer has a flatness not more than 15 nm.

The reflection layer contains an electrically conductive material.

The thin film layer is an oxide.

The thin film layer is either $SiO_x$ or $Al_2O_3$.

The thin film layer is a nitride.

The nitride is either $Si_xN_y$ or $Si_xN_yO_z$.

A semiconductor composite apparatus includes a substrate, planarizing layer, a semiconductor thin film, and a transparent conductive film layer. The planarizing layer is formed on the substrate either directly or indirectly, the planarizing layer being electrically conductive and including a first surface facing the substrate and a second surface on the side of the planarizing layer remote from the substrate, the first surface being planarized. The semiconductor thin film is bonded to the planarizing layer. The transparent conductive film layer is formed on the semiconductor thin film.

The semiconductor composite apparatus further includes an electrical conductive layer in electrical contact with the planarizing layer formed under the planarizing layer.

The planarizing layer is formed of a material transparent to light emitted from the light emitting element;

The planarizing layer is an electrically conductive film through which current flows.

The planarizing layer is a transparent conductive film.

A transparent conductive film is formed between the planarizing layer and the semiconductor film.

The electrical conductive layer is a metal thin film.

The precious metal is Au or an alloy containing Au.

The semiconductor thin film is a semiconductor element.

The semiconductor element is a light emitting element.

The light emitting element is one of a plurality of light emitting elements aligned in a line on the substrate.

The light emitting element is an LED.

The semiconductor composite apparatus further includes an integrated circuit that drives the semiconductor element.

An LED apparatus includes a substrate, a planarizing layer, and an LED thin film formed. The planarizing layer is formed on the substrate either directly or indirectly, the planarizing layer including a first surface facing the substrate and a second surface on the side of the planarizing layer remote from the substrate, the first surface being planarized. The LED thin film is formed on the planarizing layer.

An LED printhead incorporating the aforementioned LED apparatus includes an optical system that directs light emitted from the LED thin film.

An imaging apparatus includes an image forming section that forms an image on a medium, and incorporating the aforementioned LED printhead. The image forming apparatus includes an image bearing body, a charging unit, and a developing unit. The charging unit charges a surface of the image bearing body. The developing unit develops an electrostatic latent image on the image bearing body into a visible image. The LED printhead selectively illuminates the charge surface of the image bearing body to form an electrostatic latent image.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limiting the present invention, and wherein:

FIGS. 6A-6E illustrate a modification to the second embodiment;

FIG. 15 illustrates a modification to the semiconductor composite apparatus;

FIG. 16 illustrates a second modification to the semiconductor composite apparatus;

FIG. 17 illustrates a third modification to the semiconductor composite apparatus;

FIG. 18 illustrates a fourth modification to the semiconductor composite apparatus;

DETAILED DESCRIPTION OF THE INVENTION

First Embodiment

Figure 1:
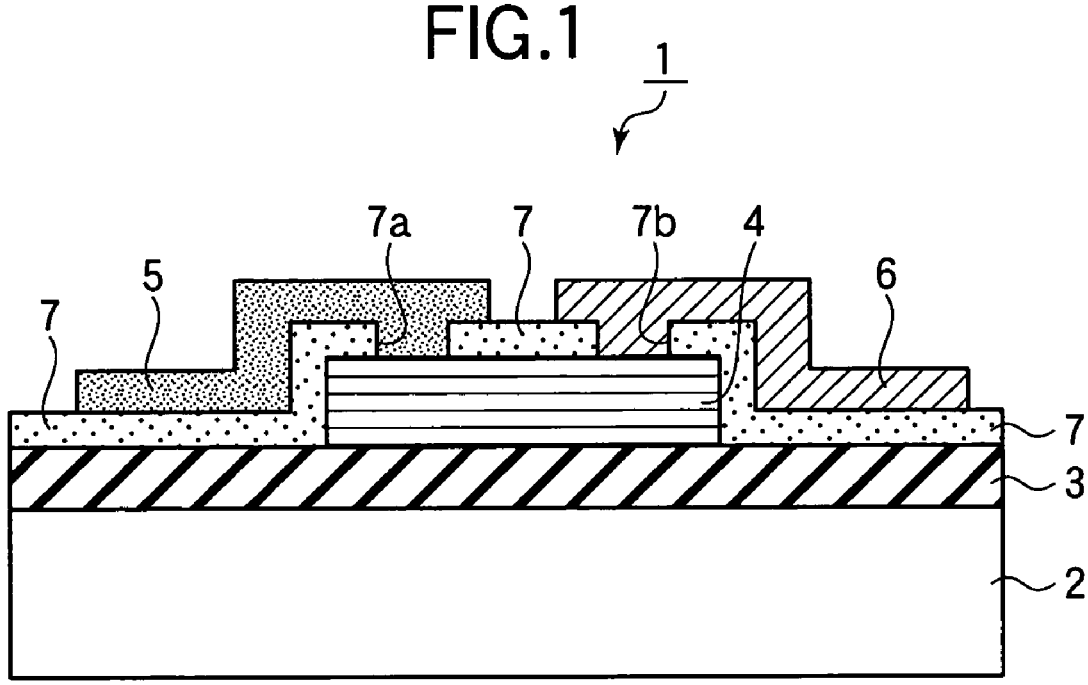
FIG. 1 diagrammatically illustrates a stacked structure of a semiconductor composite apparatus according to a first embodiment.

FIG. 1 diagrammatically illustrates a stacked structure of a semiconductor composite apparatus according to a first embodiment.

Referring to FIG. 1, a semiconductor composite apparatus includes an Si substrate 2 (first substrate) and a planarizing layer 3 formed on the Si substrate 2. The planarizing layer 3 has a predetermined flatness. A semiconductor thin film layer 4, e.g., a compound semiconductor epitaxial layer, is directly bonded onto the planarizing layer 3. The compound semiconductor epitaxial layer may take the form of, for example, an LED thin film that forms a light emitting diode. The semiconductor composite apparatus 1 corresponds to an LED device.

Figure 2:
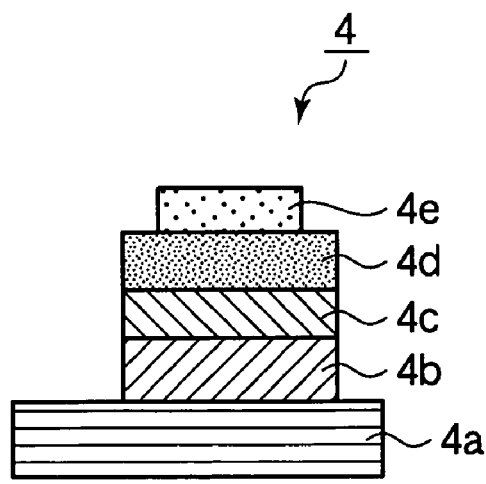
FIG. 2 diagrammatically illustrates a pertinent portion of a compound semiconductor epitaxial.

FIG. 2 diagrammatically illustrates a pertinent portion of the compound semiconductor epitaxial (semiconductor thin film layer 4), by way of an example formed of a semiconductor layer including LEDs.

Referring to FIG. 2, the semiconductor thin film layer 4 is of an epitaxial structure that includes a contact layer 4a (e.g., n-GaAs layer) of a first conductivity type, a cladding layer 4b (e.g., n-Al$_x$Ga$_{1-x}$As layer) of the first conductivity, an active layer 4c (e.g., n-Al$_y$Ga$_{1-y}$As layer) of the first conductivity type, a cladding layer 4d (e.g., p-Al$_z$Ga$_{1-z}$As layer) of a second conductivity type, and a contact layer 4e (e.g., p-GaAs layer) of the second conductivity type, which are stacked and aligned in this order from the bottom. In this example, a high efficiency LED can be formed by selecting materials such that y<x and y<z, for example.

Referring to FIG. 1, an interlayer dielectric film 7 is formed to cover the layer 3 and semiconductor thin film layer 4. The dielectric film 7 is a single layer of, for example, an Si$_x$N$_y$ film, Al$_x$O$_y$ film, Si$_x$O$_y$ film, PSG film (silicone oxide film containing P), BSG film (silicon oxide film containing B), or Si$_x$N$_y$O$_z$ film, or a stacked structure of these layers. Wires 5 and 6 are formed on the interlayer dielectric film 7, and are in contact with a region of the first conductivity type and a region of the second conductivity type of the semiconductor thin film layer 4 through openings 7a and 7b, respectively. In other words, the wire 5 is in ohmic contact with the layer 4a of the first conductivity type and the wire 6 is in ohmic contact with the layer 4e of the second conductivity type.

In the process of forming the semiconductor composite apparatus 1, the semiconductor thin film layer 4 is first formed on another substrate (second substrate), not shown, which is separate from a first Si substrate on which the semiconductor thin film layer 4 is finally mounted. For example, the second substrate is a GaAs substrate. A semiconductor thin film layer containing LEDs, i.e., n-GaAs/n-AlxGa$_{1-x}$As/n-Al$_y$Ga$_{1-y}$As/p-Al$_z$Ga$_{1-z}$As/p-GaAs is formed on the second substrate. A sacrifitial layer of, for example, AlAs is provided between the GaAs substrate and the semiconductor thin film layer 4. Then, this release layer is removed by selectively etching with diluted hydrochloride acid or hydrofluoric acid, so that the semiconductor thin film layer 4 is lifted off from the GaAs substrate.

Then, the semiconductor thin film layer 4 is directly bonded to the planarizing layer 3 on the substrate (first substrate) without using a bonding material such as an adhesive or a solder that forms eutectic.

The planarizing layer 3 may take the form of a thin film of a coating of oxide, nitride, or PSG film (silicon oxide containing P). Specific examples of the planarizing layer 3 are an SOG film (spin on glass film), a polyimide film and a film of organic matter. A stable thin film layer or thick film layer of organic material is formed by vaporizing a solvent by heat, or subjecting a solvent to cross-linking reaction by heating or irradiating light. For compound semiconductor materials having an upper layer formed of an electrovalent material, the planarizing layer 3 are preferably formed of more polarized organic materials, the same material as a component that constitutes the compound semiconductor material, or a material that contain chemically equivalent oxides (e.g., energy of activation is similar in oxidative reaction). For materials having a covalent upper layer such as Si, Ge, SiGe, and SiC, preferable materials for the planarizing layer 3 are the same material as a component that constitutes the compound semiconductor material, materials (Sixoy and SixNy, for example, x=3, y=4) that contain chemically equivalent oxides and nitrides (e.g., energy of activation is similar in oxidative reaction), or covalent organic materials.

The organic materials for the planarizing layer 3 may also be photosensitized polymers (e.g., a polymer having a carbonyl group adjacent to hetero atoms). The organic materials for the planarizing layer 3 may also be a photosensitized polymer that contains polyimide, polycarbonate, polyether imide, polyarylate, polyurethane, polyamide, or polyamide-imide.

The planarizing layer 3 has a roughness E of preferably not more than 5 nm. The roughness of the planarizing layer 3 can be measured with an atomic force microscope (AFM) or a scanning probe microscope (SPM), which is capable of measuring the surface roughness on the order of nanometers. The surface roughness of the planarizing layer 3 is defined as an average value of differences in the height of surface between peaks and valleys over a measured area before the semiconductor thin film layer 4 is bonded to the planarizing layer 3. The flatness of the planarizing layer is equivalent to the roughness of the planarizing layer.

The flatness of the planarizing layer 3 can also be measured using the following techniques. That is, the flatness may be measured in terms of a transmission electron microscopy (TEM) image of a cross section including an interface of the bonded parts. Such region may be a region in which the semiconductor thin film layer 4 has been bonded to the planarizing layer 3, or a region where the surface condition of the planarizing layer 3 is considered to be equal to the surface condition before the semiconductor thin film layer 4 is bonded to the planarizing layer 3.

The inventors conducted experiments to investigate the flatness E of the planarizing layer 3, and found the following facts.

When 20 nm<E, bonding of the semiconductor thin film layer 4 to the planarizing layer 3 is difficult.

When 10 nm<E≦20 nm, the semiconductor thin film layer 4 may be bonded at least partially.

When 5 nm<E≦10 nm, the semiconductor thin film layer 4 may be bonded but the bond strength is not good enough.

When 2 nm<E≦5 nm, the semiconductor thin film layer 4 is bonded with a sufficient bond strength.

When E≦2 nm, the semiconductor thin film layer 4 is strongly bonded to the bonding surface and hard to come off.

The following are experimental results of the thickness of the planarizing layer 3.

When the planarizing layer 3 is not so thick (e.g., the thickness is not more than 3 μm), the surface flatness of the Si substrate 2 is preferably not more than 50 nm. The definition of surface flatness of the Si substrate 2 is the same as that of the flatness E of the planarizing layer 3. When the surface flatness of the Si substrate 2 is more than 10 nm, the thickness of the planarizing layer 3 is preferably more than 10 nm. The "surface flatness of the Si substrate 2" represents the flatness of the surface of a top layer formed on the Si substrate when a structure such as a thin film layer is formed on the substrate.

It is desirable that the planarizing layer 3 as-formed on the substrate 2 has a sufficient flatness such that the semiconductor thin film can be bonded strongly on the planarizing layer. However, the planarizing layer 3 may be subjected to a chemical surface treatment (e.g., etching), a mechanical surface treatment (e.g., lapping), or a chemical-mechanical polishing (CPM) (combination of chemical treatment and mechanical treatment) in order to provide good enough flatness for strong bond of the semiconductor thin film on the planarizing layer.

Figure 3:
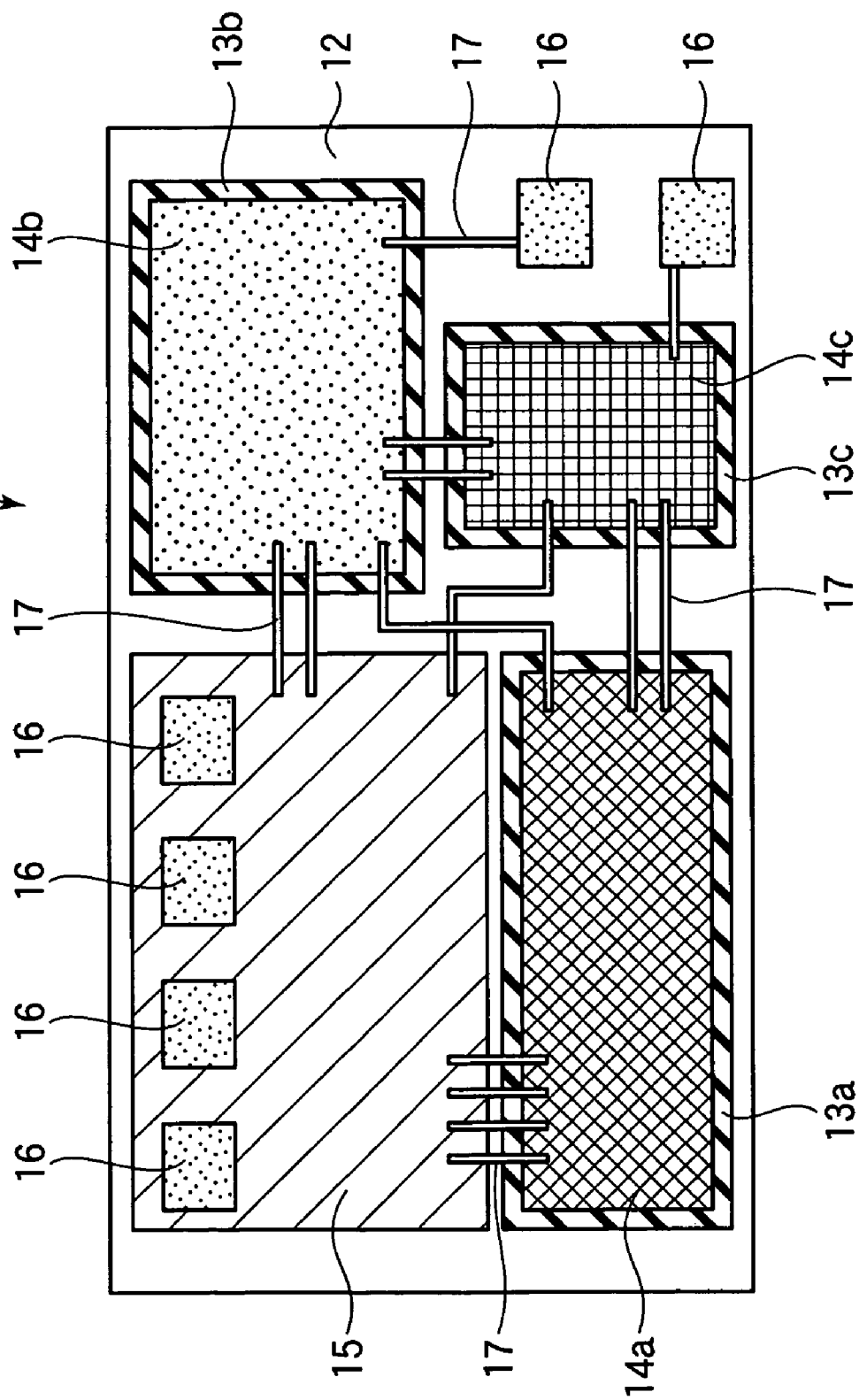
FIG. 3 is a top view illustrating another example of a composite semiconductor apparatus.

FIG. 3 is a top view illustrating another example of a composite semiconductor apparatus in which the semiconductor thin film layer 4 is bonded on the planarizing layer 3. For better understanding, interlayer dielectric films are not indicated in FIG. 3.

Referring to FIG. 3, a plurality of planarizing layers 13a, 13b, and 13c and the semiconductor thin film layers 14a, 14b, and 14c are formed on the Si substrate 12 (first substrate). The planarizing layers 13a-13c are formed on the Si substrate 12. The semiconductor thin films 14a, 14b, and 14c are bonded on the layers 13a-13c. The semiconductor thin films 14a, 14b, and 14c are previously formed on the second substrate separate from the Si substrate 12 and are lifted off from the second substrate, then bonded on the planarizing layers 13a, 13b, 13c on the Si substrate 12. These semiconductor thin film layers 14a, 14b, and 14c (thus 13a, 13b, and 13c) may include different forms of semiconductor devices, e.g., light emitting elements, light receiving elements, signal transmitting elements, or signal receiving elements. The semiconductor thin film layer 11 in FIG. 3 includes a semiconductor thin film layer 14a as a light emitting element, a semiconductor thin film layer 14b as a light receiving element, and a semiconductor thin film layer 14c as a signal transmitting/receiving element. For example, the semiconductor thin film layer 14a may take a stacked structure as shown in FIG. 2 while the semiconductor thin film layers 14b and 14c may take another stacked structure.

Formed on the Si substrate 12 are a driving integrated circuit 15, input/output terminal pads 16 for inputting and outputting signals and receiving a power supply, and wirings to connect device elements. Such a chip having integrated functions may be formed on a wafer at a time.

As described previously, the semiconductor thin film layer may be grown on a substrate, then lifted off by a chemical etching technique, and finally transferred to another substrate. The semiconductor thin film layer may also be separated from a substrate by a chemical technique or a mechanical lapping technique. The semiconductor thin film layer may also be prepared using techniques other than those described above.

The first substrate is not limited to an Si substrate and may be other substrates such as ceramic, metal, glass, quartz, sapphire, and organic materials.

Although a semiconductor thin film layer has been described as being bonded onto a planarizing layer, the semiconductor thin film layer may be bonded on a layer of other material.

The planarizing layers 13a. 13b, and 13c (i.e., the semiconductor thin film layers 14a, 14b, and 14c) has been described as being separate layers, the planarizing layers 13a, 13b, and 13c may be replaced by a single layer.

The planarizing layer formed on the substrate allows strong bonding of the semiconductor thin film layer on the substrate, and provides high-quality semiconductor composite apparatus.

Second Embodiment

Figure 4:
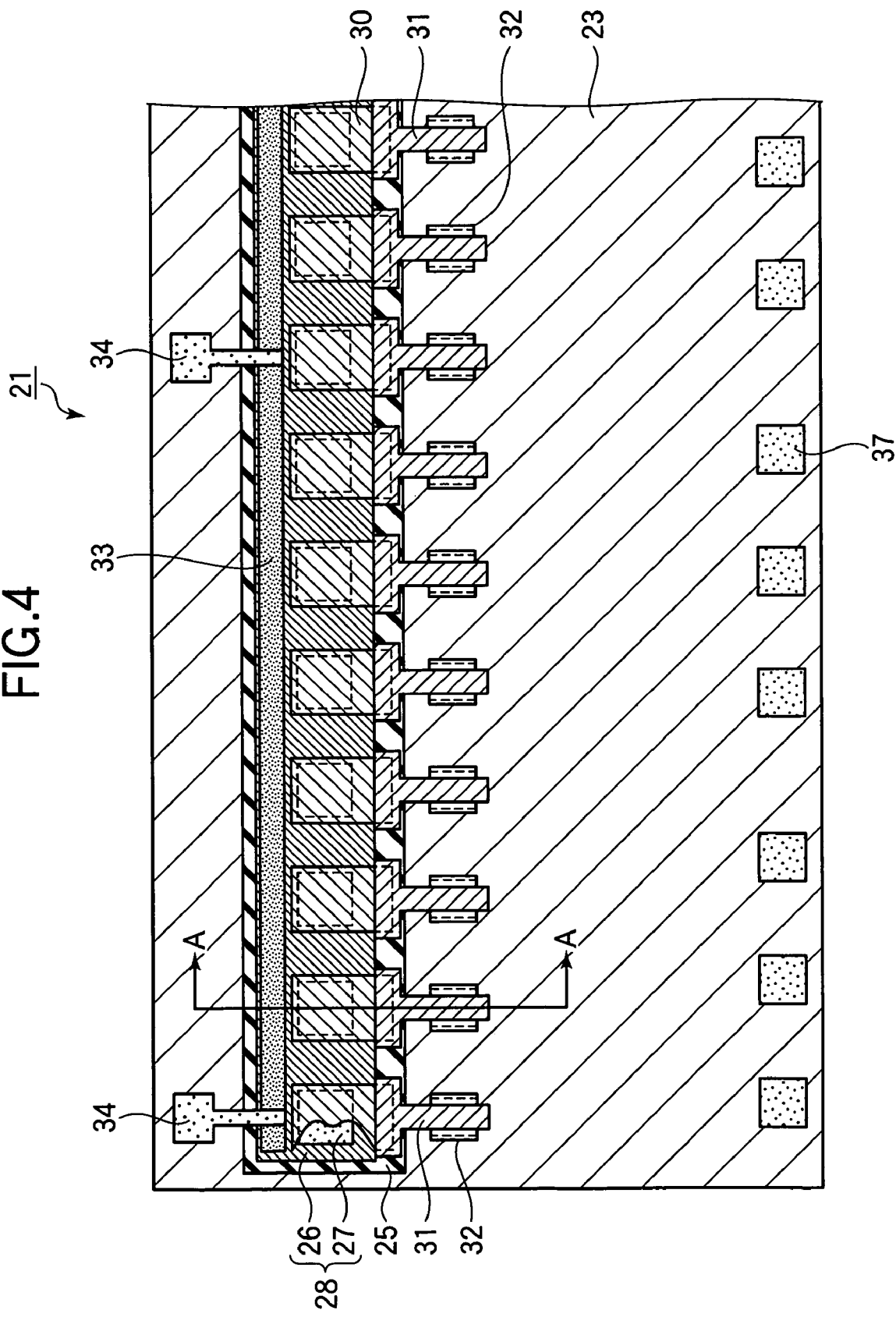
FIG. 4 is a top view illustrating a pertinent portion of a semiconductor composite apparatus according to a second embodiment.
Figure 5:
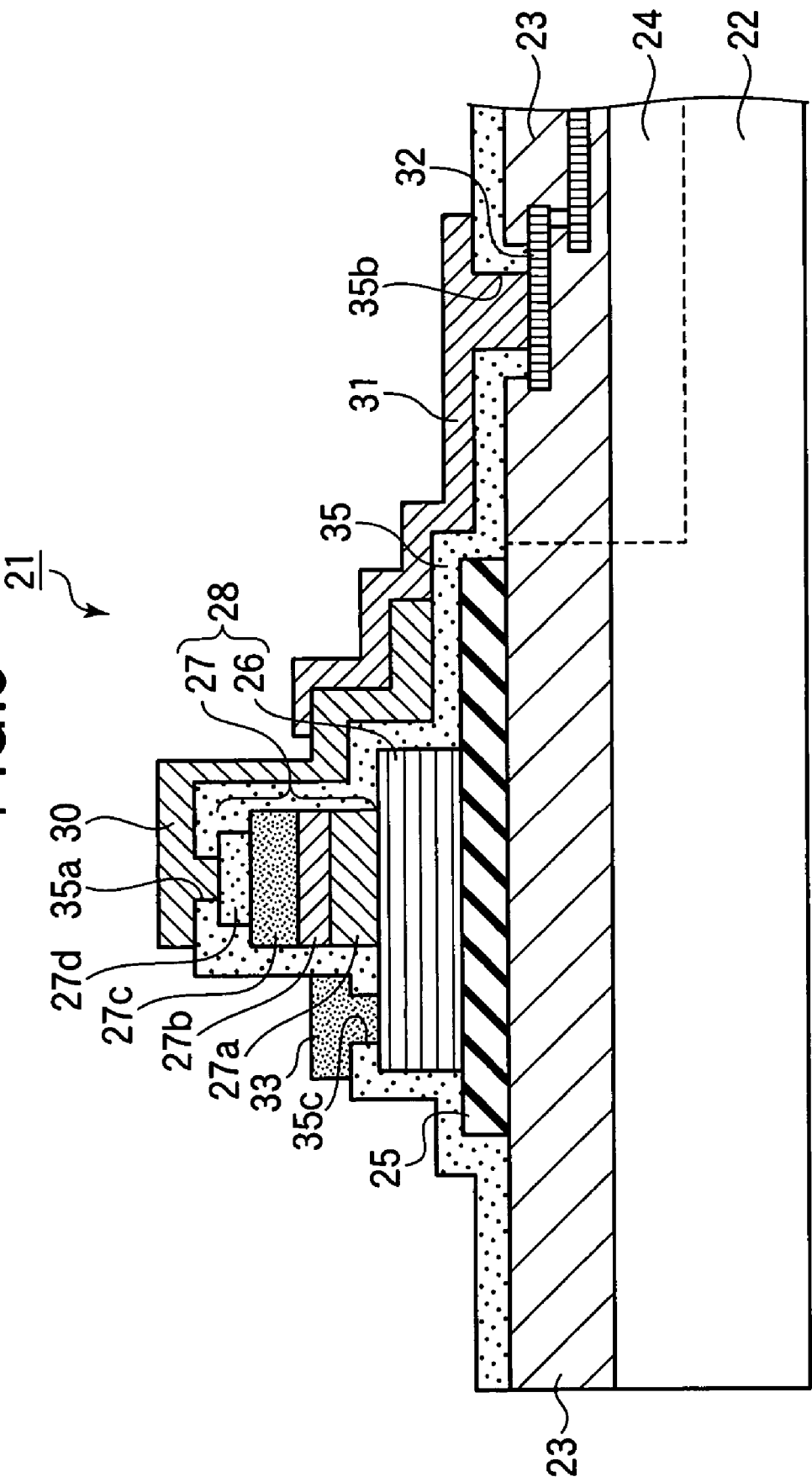
FIG. 5 is a cross-sectional view taken along a line A-A of FIG. 4.

FIG. 4 is a top view illustrating a pertinent portion of a semiconductor composite apparatus 21 according to a second embodiment. FIG. 5 is a cross-sectional view taken along a line A-A of FIG. 4. For better understanding the features of the second embodiment, FIG. 4 shows the semiconductor composite apparatus 21, omitting an interlayer dielectric film 35 (FIG. 5) that prevents short-circuits between wires and conductive layers, and partly omitting individual electrode contacts 30.

Referring to FIG. 5, the semiconductor composite apparatus 21 includes an Si substrate 22 (first substrate), and a multilayer dielectric region 23 formed on the Si substrate 22. The Si substrate 22 and multilayer dielectric region 23 share a region 24 in which driving integrated circuits are fabricated by interconnecting FETs and resistors with multilayer wiring patterns. The driving integrated circuits drive light emitting elements described later. The multi-layer dielectric region 23 is a region having a stacked structure of interlayer dielectric film equivalent to the region 24. A planarizing layer 25 is formed on the multi-layer dielectric region 23 and a semiconductor thin film layer 28 is formed on the planarizing layer 25.

In the manufacturing process of the semiconductor composite apparatus, the semiconductor thin film epitaxial layer 28 is grown on a second substrate, not shown, lifted off from the second substrate. The semiconductor thin film layer 28 is finally bonded on the Si substrate 22 (first substrate). For example, the second substrate is a GaAs substrate on which a stacked structure of n-GaAs/n-Al$_x$Ga$_{1-x}$As/n-Al$_y$Ga$_{1-y}$As/p-Al$_z$Ga$_{1-z}$As/p-GaAs is formed. A sacrifitial layer of, for example, AlAs is provided between the GaAs substrate and the semiconductor thin film layer 28. Then, this sacrifitial layer is selectively etched with diluted hydrochloride acid or hydrofluoric acid, so that the semiconductor thin film layer 28 is lifted off from the GaAs substrate. The semiconductor thin film layer 28 is then bonded onto the planarizing layer 25 as shown in FIG. 5.

The semiconductor thin film layer 28 is partially etched such that at least pn junctions are divided into individual elements, thereby providing a lower region 26 and a plurality of upper structures 27 that are individual elements. The lower region 26 includes a contact layer of a first conductivity type (e.g., n-GaAs layer) and the upper structure 27 includes a cladding layer 27a of the first conductivity (e.g., n-Al$_x$Ga$_{1-x}$As layer), an active layer of the first conductivity type (e.g. n-Al$_y$Ga$_{1-y}$As layer), a cladding layer 27c of a second conductivity type (e.g., p-Al$_z$Ga$_{1-z}$As layer), and a contact layer 27d of the second conductivity type (e.g., p-GaAs layer). When y<x and y<z, the upper structure 27 is a high-efficiency light emitting element. As described above, a plurality of upper structures 27 have been formed in the upper region of the semiconductor thin film 28, each of the upper structure 27 being an individual element.

The individual electrode contacts 30 are formed on the interlayer dielectric film 35 to partially cover the upper structures 27, and electrically connected to the contact layer 27d of the second conductivity through an opening 35a formed in the interlayer dielectric film 35. The individual electrode contacts 30 are a transparent conductive film, and are, for example, a thin film of an oxide of an inorganic material such as indium/tin oxide (ITO) or zinc oxide (ZnO), or a conductive film of an organic material. Thin metal wires 31 are formed on the interlayer dielectric film 35 and connect between the individual electrode contacts 30 and output terminals 32 of the driving integrated circuits for driving the LEDs. The thin film metal wire 31 runs through an opening 35 formed in the interlayer dielectric film 35.

A common electrode contact 33 is a metal contact formed on the interlayer dielectric film 35 at a location that faces the lower region 26, and contacts the lower region 26 through the opening 35c formed in the interlayer dielectric film 35.

As shown in FIG. 4, the planarizing layer 25, lower region 26, and common electrode contact 33 extend in a longitudinal direction of the semiconductor composite apparatus 21 such that the upper structures 27, which serve as a light emitting element, are aligned in a line. The output terminals 32 of the driving integrated circuits are located in the vicinity of corresponding light emitting elements. The upper structures 27 and the output terminals 32 are electrically connected through the transparent individual electrode contacts 30 and the metal wires 31.

Wire bonding pads or connection pads 34 are disposed at predetermined intervals along the common electrode contact 33 on the interlayer dielectric film 35 (FIG. 5), and are electrically connected to the common electrode contact 33, thereby applying a common potential to the lower region 26. The pads 34 need not be disposed at regular intervals and also can be replaced by a single pad. Input pads 37 serve to connect the semiconductor composite apparatus 21 to external circuits to supply electric power and control signals to the integrated circuits in the driving integrated circuit region 24.

The planarizing layer 25 may be formed of a polyimide layer or a layer of other organic material. The planarizing layer 25 may also be a coating film such as oxide layer (e.g., SiO2). Further, the planarizing layer 25 may be a film of SiO$_x$, SiN, SiON, ITO, or ZnO. SiO$_x$ may be formed by, for example, sputtering, CVD, p-CVD, or coating. The SiN and SiON films may be formed by p-CVD. The ITO film may be formed by sputtering. The ZnO film may be formed by sputtering or ion plating. The Al$_2$O$_3$ film may be formed by sputtering.

The planarizing layer 25 may be a layer of an organic material. The film of organic material may be formed by vapor deposition, printing, or coating. Such organic materials include polyacetylene, polypyrrole, polyparaphenylene, poly p-phenylenevinylen, polynaphthylenvinylen, polyaniline, and polyethylene terephthalate. The organic materials may be polymethyl methacrylate, polypropylene, polycarbonate, metyl methacrylate styrene, polyvinyl carbonate (PVC), polymethylpenten, polystyrene and alicyclic polyrorefin resin. For example, a side chain may be added to these organic materials so that the organic material melts in a solvent, and melted organic material may be applied to the substrate to form an organic layer.

Defects such as a void at the bonding interface of the semiconductor thin film layer 28 directly affect the characteristics, yield, and reliability of the light emitting elements. The adhesion of the semiconductor thin film layer 28 bonded to the planarizing layer 25 should be good enough so that no such defect appears during the fabrication processes such as formation of the interlayer dielectric film, formation of openings in the interlayer dielectric film, and wiring. The adhesion of the semiconductor thin film can be evaluated by a simple technique, e.g., an etching test or a tape test. The flatness E of the planarizing layer 25 necessary for good adhesion is preferably not more than 5 nm, and more preferably not more than 2 nm for strong adhesion. The definition of flatness E is the same as that in the first embodiment.

In the second embodiment, the semiconductor thin layer 28 is selectively etched away into the individual active layers by mesa etching, thereby defining individual upper structures 27 (light emitting elements). Instead, the semiconductor epitaxial layer of the first conductivity type may be selectively doped with an impurity of the second conductivity type. The semiconductor thin film layer 28 and the common electrode may be divided into individual upper structures 27 in any appropriate way. The light emitting elements may be wired such that they can be matrix-driven.

FIGS. 6A-6E illustrate a modification to the second embodiment. Referring to FIG. 6A, the transparent individual electrodes 30 (FIG. 5) are omitted, and the metal thin film wire 36 may be made to cover a part of the light emitting regions (upper structure 27) such that the metal thin film wire 36 is in electrical contact with the contact layer 27d of the corresponding upper structure 27. FIGS. 6B-6E are top views illustrating other examples of connection between the metal thin film wire 36 and the light emitting element. FIG. 6B shows the pad 36 formed to extend into a part of the light emitting region while FIG. 6C shows the metal thin film wire 36 formed to cover an end portion of the light emitting region. FIG. 6D shows another configuration in which a conductive layer region 27g is provided in the upper structure 27 and extends from a light emitting region 27f and the metal thin film wire 36 is connected to the conductive layer region 27g. FIG. 6E illustrates a configuration in which the metal thin film wire 36 extends through the light emitting region. The metal thin film wire 36 may be of any shape. The metal thin film wire 36 may be formed to contact the end portion of the light emitting region. The metal thin wire of a cross shape may also formed on the lightemitting element. Thus, the electrical contact layer can be formed such that light emitted from the light emitting region is not blocked completely when a transparent material is not used for the electrode.

As described above, with the semiconductor composite apparatus according to the second embodiment, the semiconductor thin film layer is bonded onto a flat planarizing layer to form an array of light emitting elements having light emitting regions. This configuration offers good adhesion and provides a reliable light emitting array with minimum variations in characteristics.

Third Embodiment

Figure 7:
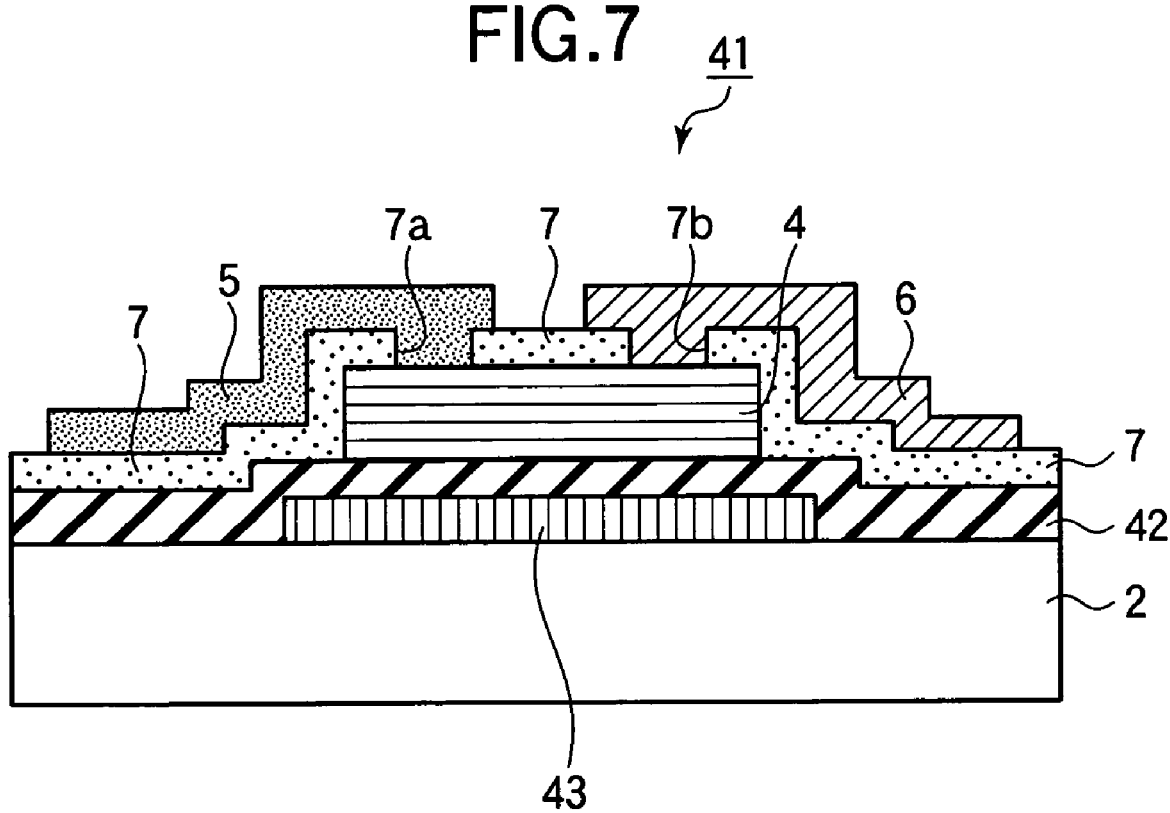
FIG. 7 illustrates diagrammatically a pertinent portion of a stacked structure of a semiconductor composite apparatus according to a third embodiment.

FIG. 7 illustrates diagrammatically a pertinent portion of a stacked structure of a semiconductor composite apparatus according to a third embodiment.

A semiconductor composite apparatus 41 differs from the semiconductor composite apparatus 1 according to the first embodiment in that a reflection layer 43 is employed under a planarizing layer 42. Elements similar to those in the first embodiment have been given the same reference numerals and their description is omitted. A description will be given of only portions different from the first embodiment.

The reflection layer 43 formed under the planarizing layer 42 is, for example, a single metal layer formed of Ti, Au, or Ge, a stacked layer of Ti, Au, and Ge, a composite structure of Ti, Au, and Ge, or an alloy of Ti, Au, and Ge. The reflection layer 43 may also be a stacked layer that contains Ti, Pt, or Au, or a layer that contains Cr, Ni, Pd, or Al. If the planarizing layer 42 is to be an organic layer, the uppermost layer of the reflection layer 43 is preferably formed of Ti, Au, Cr, Ni, or Al. If a metal reflection layer is to be formed in the process of fabricating integrated circuits on an Si substrate, a metal material that does not contain Au is preferred.

The reflection layer 43 need not be a metal layer but may be a stacked layer of materials such as a semiconductor/dielectric film or a semiconductor/semiconductor layer. The semiconductor/dielectric film may be, for example, an $Si/SiO_2$ layer or an $SiO_2/TiO_2$ layer. The reflection layer 43 may also be a stacked layer of low-refraction index material/high-refraction index material. The low-refraction index material includes $SiO_2$, $CaF_2$, LiF, and $MgF_2$. The high-refraction index material includes $TiO_2$, $CeO_2$, CdS, and ZnS. The reflection layer 43 may also be a stacked layer of metal/semiconductor.

Figure 8A:
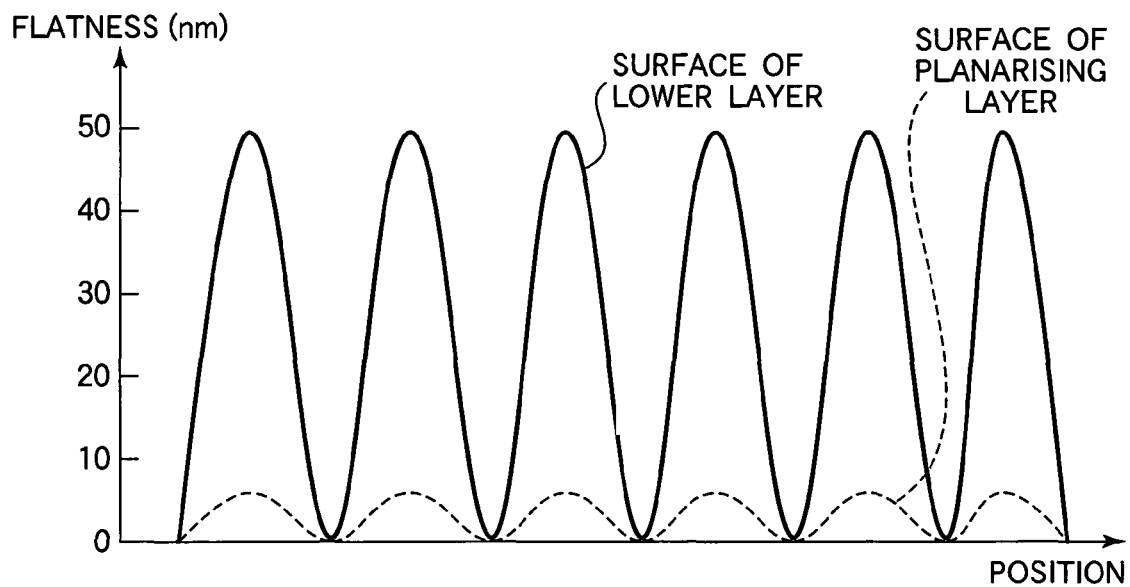
FIG. 8A illustrates the effect of a lower layer on the flatness of a planarizing layer.

The roughness of the surface of the reflection layer 43 is preferably not more than 50 nm, and more preferably not more than 15 nm. Such a range of the roughness of the reflection layer 43 ensures that the planarizing layer 42 formed on the reflection layer 43 has good flatness. FIG. 8A illustrates the effect of the lower layer on the flatness of the planarizing layer. As is clear from FIG. 8A, if the lower layer (reflection layer 43 in FIG. 7) has a flatness of 50 nm, the flatness of the planarizing layer 43 is 5 nm. In other words, the flatness being is improved by an order of magnitude. The definition of flatness or roughness is the same as that in the first embodiment.

Figure 8B:
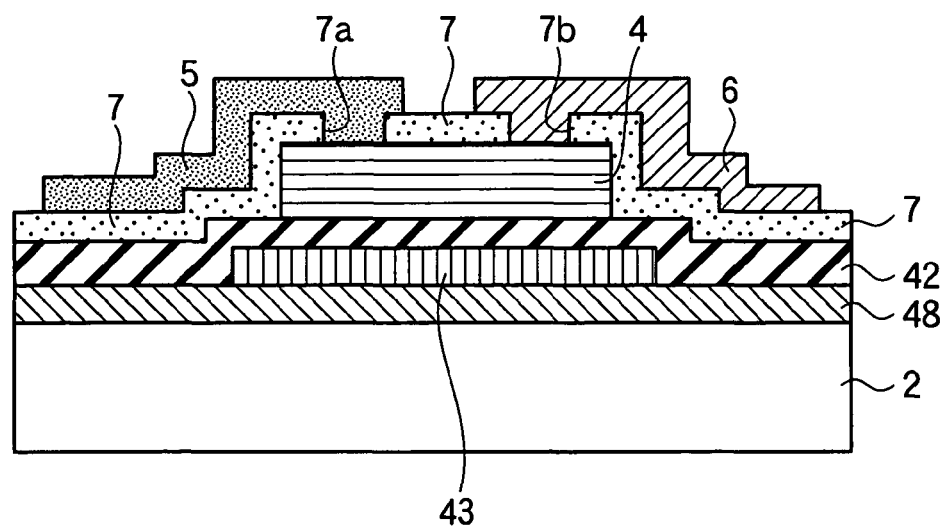
FIG. 8B illustrates a modification to the semiconductor composite apparatus.

The reflection layer 43 need not be formed over the entire surface of the substrate, but may be patterned. The patterned reflection layer 43 allows formation of the planarizing layer 42 in the form of a thin film of an organic material with good adhesion. If the reflection layer 43 takes the form of a metal layer, it may also serve as a conductive layer or a wiring layer formed under the planarizing layer 42. FIG. 8B illustrates a modification to the semiconductor composite apparatus 41. That is, a dielectric film 48 of a SiN film or a $SiO_2$ film may be formed between the substrate 2 and the refection layer 42.

Figure 9:
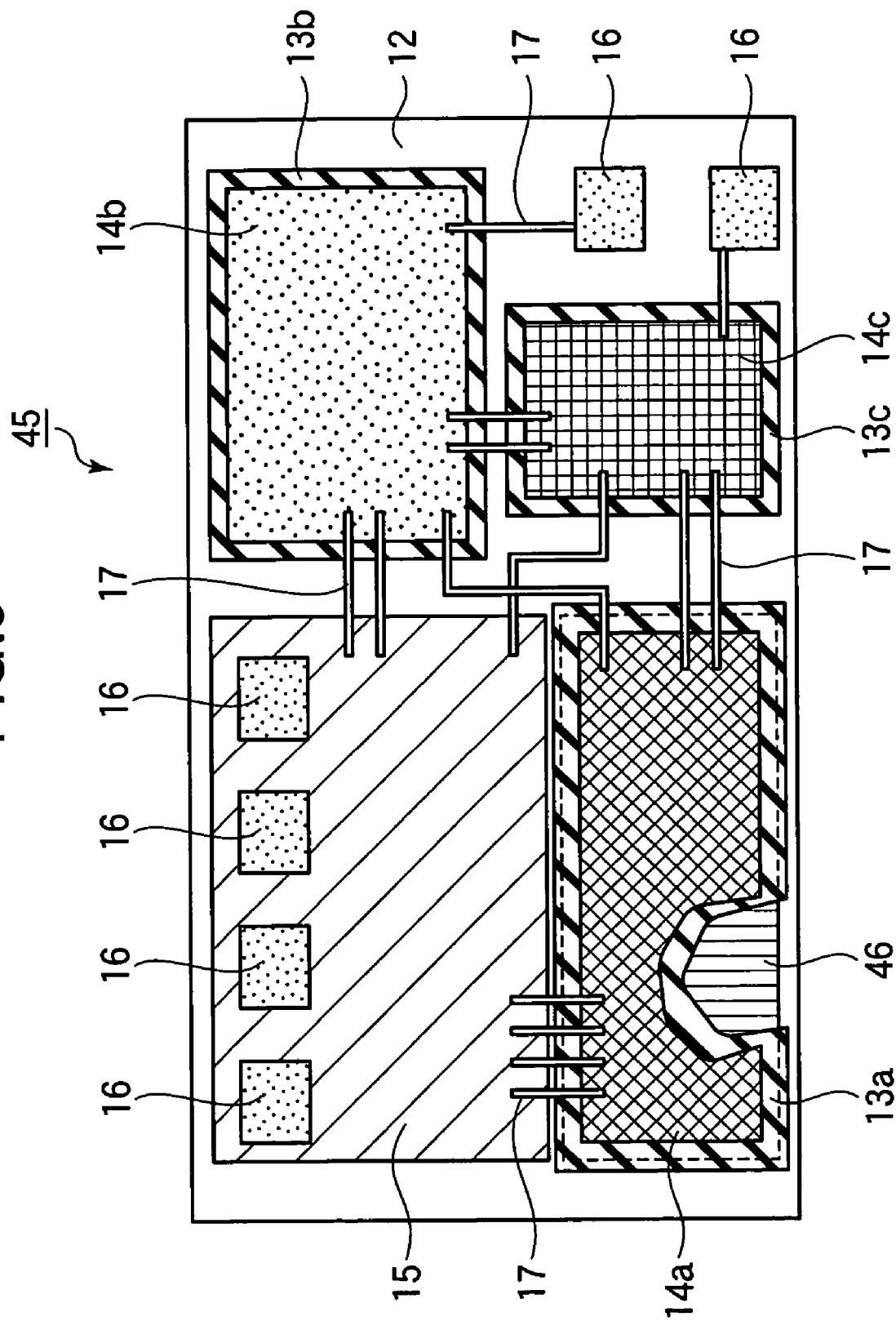
FIG. 9 is a top view of the semiconductor composite apparatus in FIG. 7.

FIG. 9 is a top view of the semiconductor composite apparatus in FIG. 7 where the semiconductor thin film layer 4 is bonded onto the planarizing layer 42. For describing the features of the fourth embodiment more clearly, the interlayer dielectric film is omitted and part of the planarizing layer 13a and the semiconductor thin film layer 14a are shown cut away.

The semiconductor composite apparatus 45 in FIG. 9 differs from the semiconductor composite apparatus 11 in the first embodiment in that a reflection layer 46 is formed under the planarizing layer 13a. Elements similar to those in the first embodiment have been given the same reference numerals and their description is omitted.

The semiconductor thin film layer 14a is light emitting elements (e.g., an LED array in which LEDs are arranged in one dimensional area or two dimensional area, or a laser diode array in which laser diodes are arranged in one dimension area or in two dimensional area). The planarizing layer 13a is formed under the semiconductor thin film layer 14a, and the reflection layer 46 is formed under the semiconductor thin film layer 13a. The semiconductor thin film layer 14a may have the same configuration as the semiconductor thin film layer 28 of the second embodiment.

With the aforementioned configuration, the light emitting element formed in the semiconductor thin film layer 14a emits light. The light emitted toward the reflection layer 46 is reflected by the reflection layer 46 and is emitted from the top surface of the semiconductor thin film layer 14a. This configuration offers more efficient utilization of light emitted from the light emitting element.

In order to minimize the light absorption by the planarizing layer 13a, the thickness of the planarizing layer 13a is made as small as possible. Especially, if the planarizing layer 13a is formed of an organic film, the thickness is preferably not more than 1 µm. For example, experiment shows that the planarizing layer 13a formed of polyimide of not more than 1 µm increases the amount of light emitted from the semiconductor thin film layer 14a by a factor of 2 due to reflection by the reflection layer 46.

The reflection layer 46 may be formed by applying or printing a liquid conductive material. For example, a material that contains a metal material cures through annealing after coating to form a substantially metal layer or a conductive layer.

Fourth Embodiment

Figure 10:
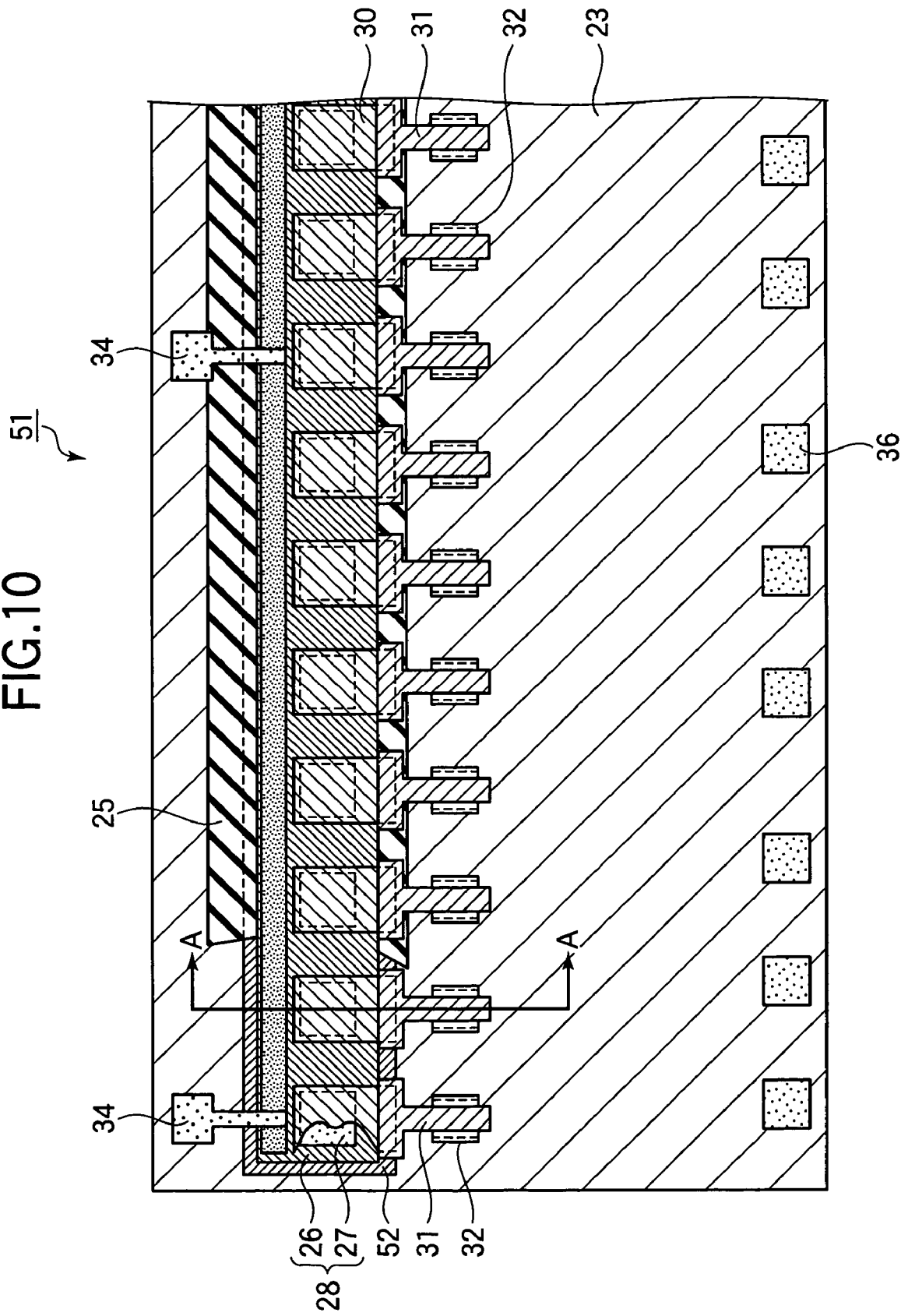
FIG. 10 is a top view of a semiconductor composite apparatus illustrating a pertinent portion.
Figure 11:
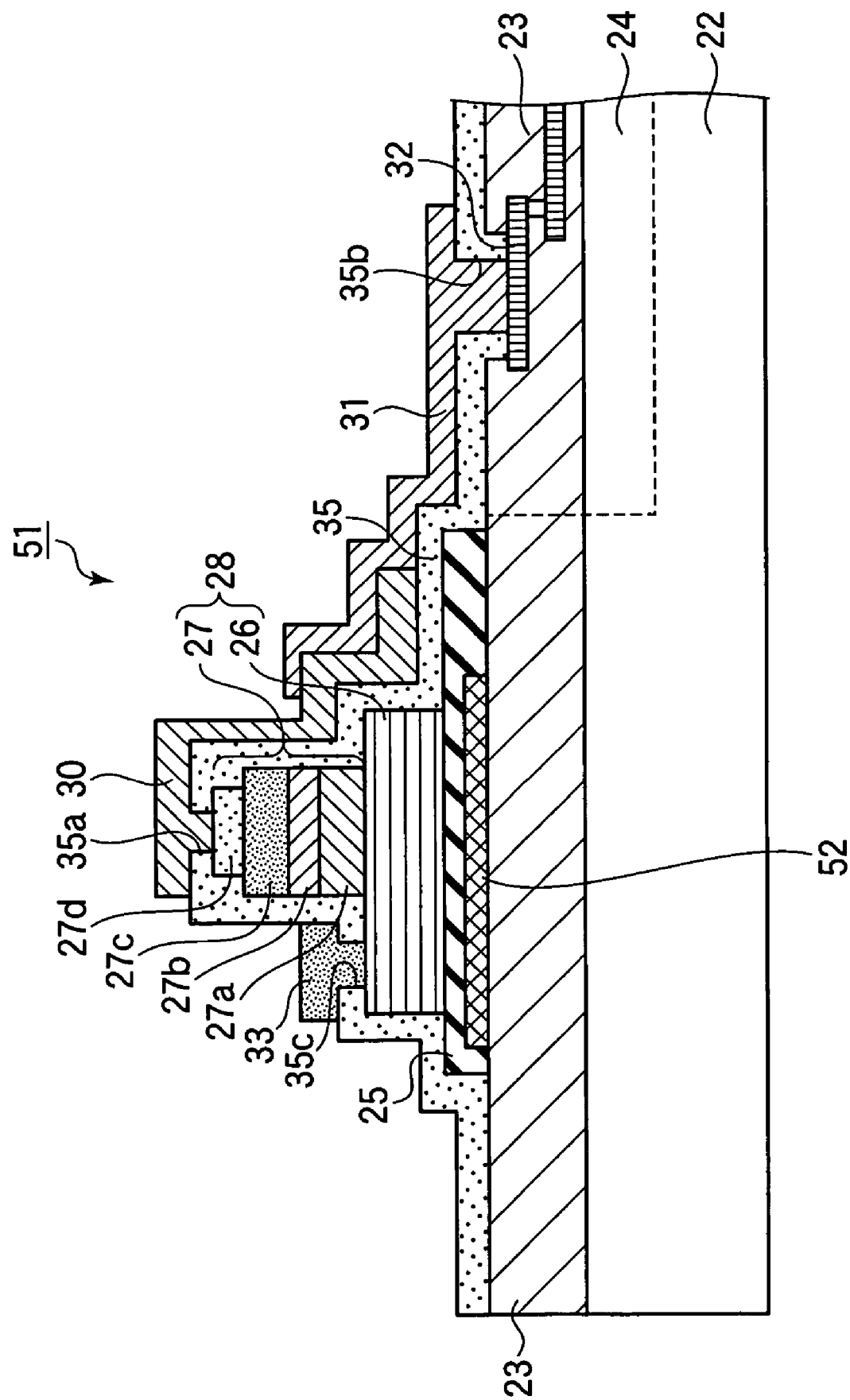
FIG. 11 is a cross sectional view taken along a line A-A of FIG. 10.

FIG. 10 is a top view of a semiconductor composite apparatus 51 illustrating a pertinent portion. FIG. 11 is a cross sectional view taken along a line A-A of FIG. 10. For describing the features of the fourth embodiment more clearly, FIG. 10 shows the semiconductor composite apparatus partially omitting an interlayer dielectric film 35 (FIG. 5) that prevents short-circuit between wires and conductive layers and individual electrode contacts 30.

The semiconductor composite apparatus 51 differs from the semiconductor apparatus 21 in FIG. 5 in that a reflection layer 52 is formed under the planarizing layer 25. Elements similar to those in the first embodiment have been given the same reference numerals and their description is omitted. FIG. 11 shows the reflection layer 52 formed above the multilayer dielectric film region 23 but may also be formed in contact with the substrate 22. The reflection layer 52 need not be a multilayer film, but may be a single layer formed on the substrate 22.

The reflection layer 52 formed under the planarizing layer 25 is, for example, a single metal layer formed of Ti, Au, or Ge, a stacked layer of Ti, Au, and Ge, a composite structure of Ti, Au, and Ge, or an alloy of Ti, Au, and Ge. The reflection layer 43 may also be a stacked layer that contains Ti, Pt, or Au, or a layer that contains Cr, Ni, Pd, or Al. if the planarizing layer 25 is a layer of an organic material, the uppermost layer of the reflection layer 52 is preferably formed of Ti, Au, Cr, Ni, or Al. If a metal reflection layer is to be formed in the process of fabricating an integrated circuit on an Si substrate, a metal material (e.g., material containing Ni, Pt, Ti, or Al) that does not contain Au is preferred.

The reflection layer 52 need not be a metal layer, but may be a stacked layer of materials such as a semiconductor/dielectric film or a semiconductor/semiconductor layer. The semiconductor/dielectric film may be, for example, a Si/SiO$_2$ layer or a SiO$_2$/TiO$_2$ layer. The reflection layer 52 may also be a stacked layer of low-refraction index material/high-refraction index material. The low refraction index material includes SiO$_2$, CaF$_2$, LiF, and MgF$_2$. The high refraction index material includes TiO$_2$, CeO$_2$, CdS, and ZnS. The reflection layer 52 may also be a stacked layer of metal/semiconductor.

The flatness or roughness of the surface of the reflection layer 52 is preferably not more than 50 nm, and more preferably not more than 15 nm. Such a range of the flatness of the reflection layer 52 ensures that the planarizing layer 25 formed on the reflection layer 52 has good flatness. The definition of flatness or roughness of the reflection layer 52 is the same as that in the first embodiment.

The reflection layer 52 need not be formed over the entire surface of the substrate, but may be patterned. The patterned reflection layer 52 allows formation of the planarizing layer 25 in the form of a thin film of an organic material with good adhesion. If the reflection layer 52 takes the form of a metal layer, it may also serve as a conductive layer or a wiring layer formed under the planarizing layer 25.

According to the fourth embodiment, a semiconductor thin film layer is boned onto a flat planarizing layer to form an array of light emitting elements. This configuration provides good adhesion of the semiconductor thin film to the substrate, and offers an array of light emitting elements with good reliability and a minimum variation of the characteristics of the light emitting elements.

Fifth Embodiment

Figure 12:
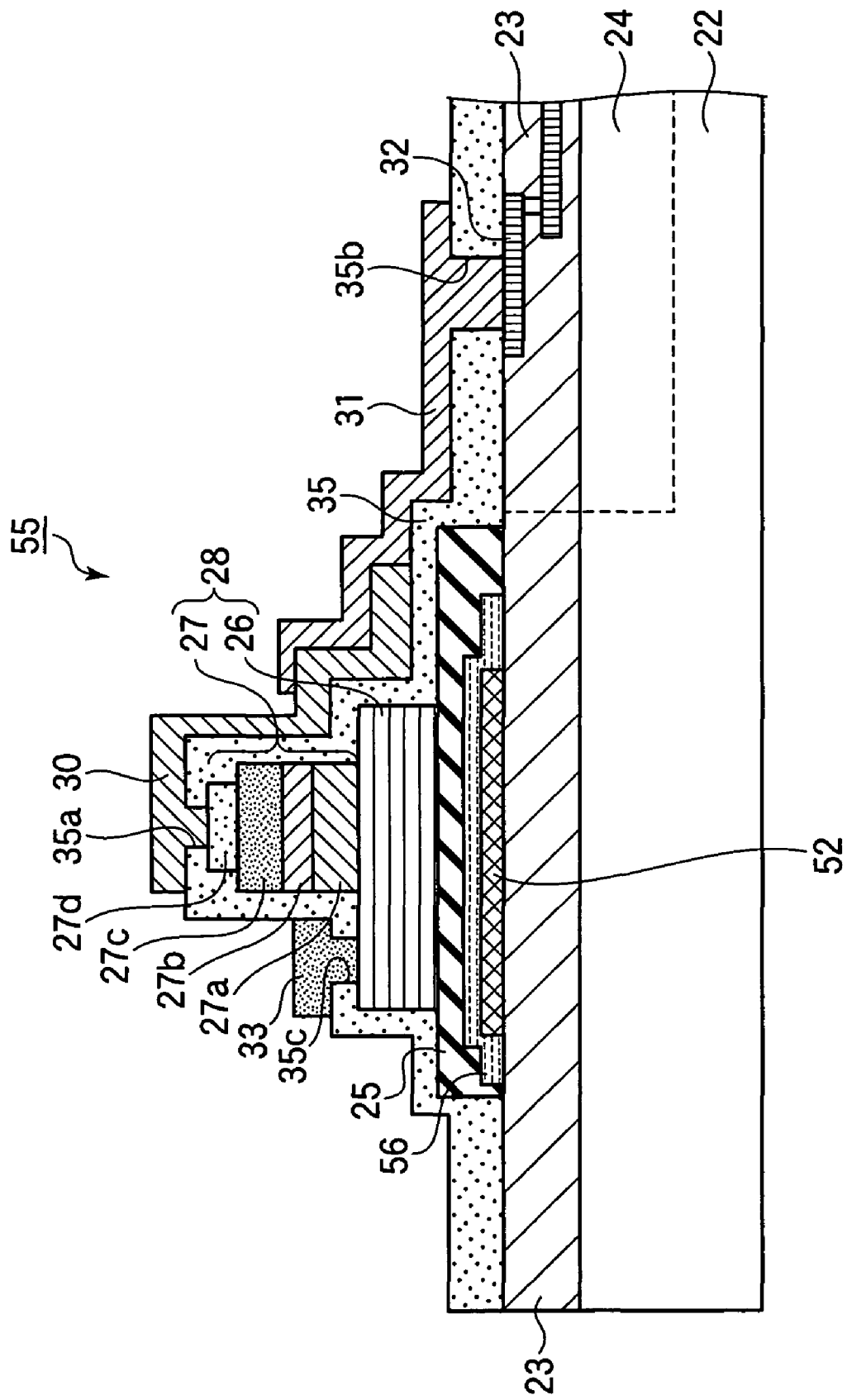
FIG. 12 is across-sectional view of a semiconductor composite apparatus according to a fifth embodiment.

FIG. 12 is a cross-sectional view of a semiconductor composite apparatus 55 according to a fifth embodiment. The semiconductor composite apparatus 55 differs from the semiconductor apparatus 51 according to the fourth embodiment (FIG. 11) in that an intermediate layer 56 of an inorganic material is formed between the reflection layer 52 and the planarizing layer 25. Elements similar to those in the first embodiment have been given the same reference numerals and their description is omitted. FIG. 12 is a cross sectional view taken along a line A-A of FIG. 10.

Referring to FIG. 12, the intermediate layer 56 is formed between the reflection layer 52 and planarizing layer 25. The reflection layer 52 is preferably formed of materials mentioned in the third and fourth embodiments. The planarizing layer 25 is preferably formed of materials mentioned in the first to fourth embodiments.

The intermediate layer 56 may be an oxide film or a nitride film: SiO$_x$ (e.g., x=2), Si$_x$O$_y$N$_z$, Si$_x$N$_y$, or Al$_2$O$_3$.

As described above, the semiconductor composite apparatus 55 according to the fifth embodiment is advantageous in that the intermediate layer 56 of an inorganic material increases adhesion of the planarizing layer 25 of an inorganic material formed on the reflection layer 52. The electrode of the fifth embodiment may be modified in a manner similar to that of the second embodiment (FIGS. 6A-6E).

Sixth Embodiment

Figure 13:
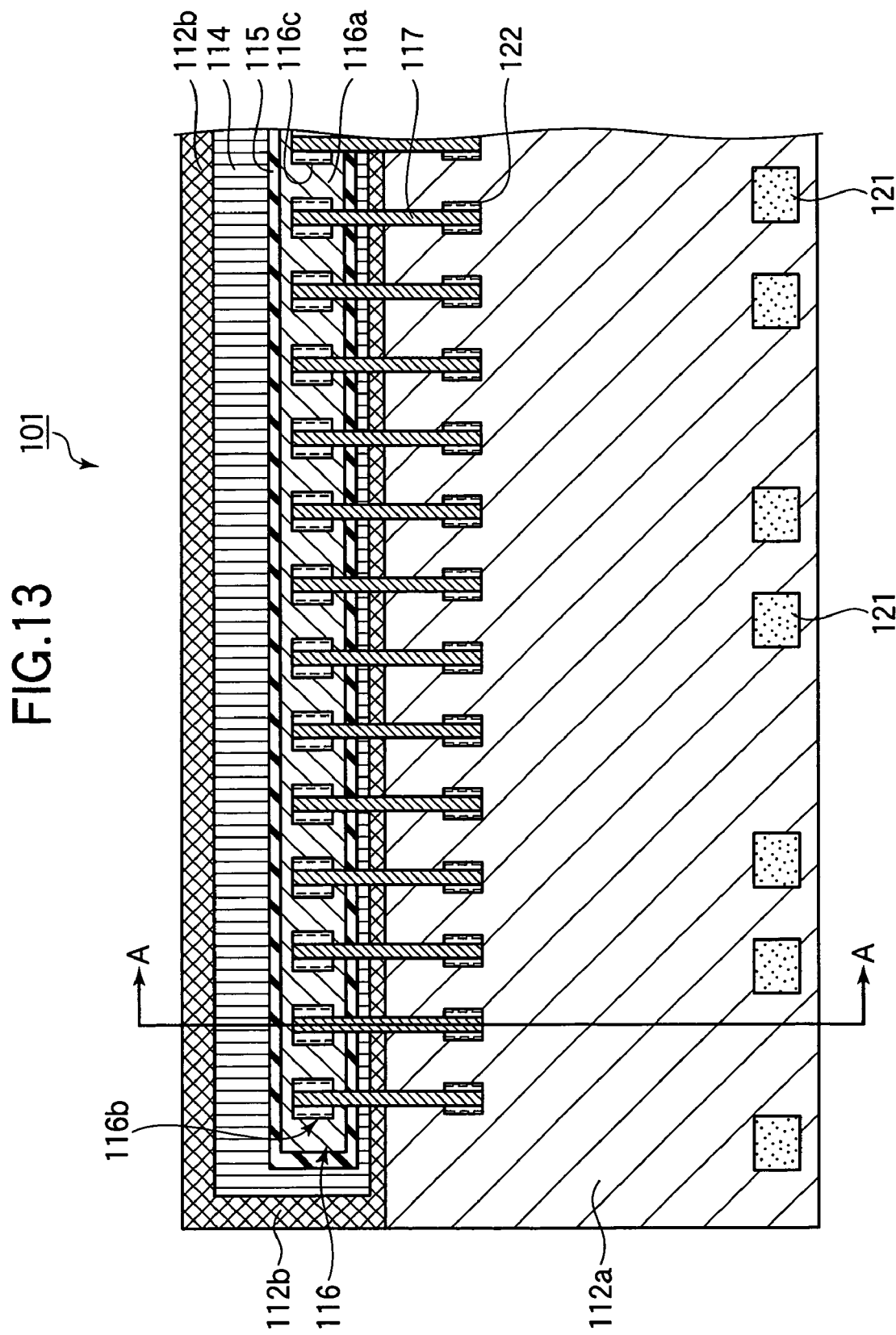
FIG. 13 is a top view of a semiconductor composite apparatus according to a sixth embodiment.
Figure 14:
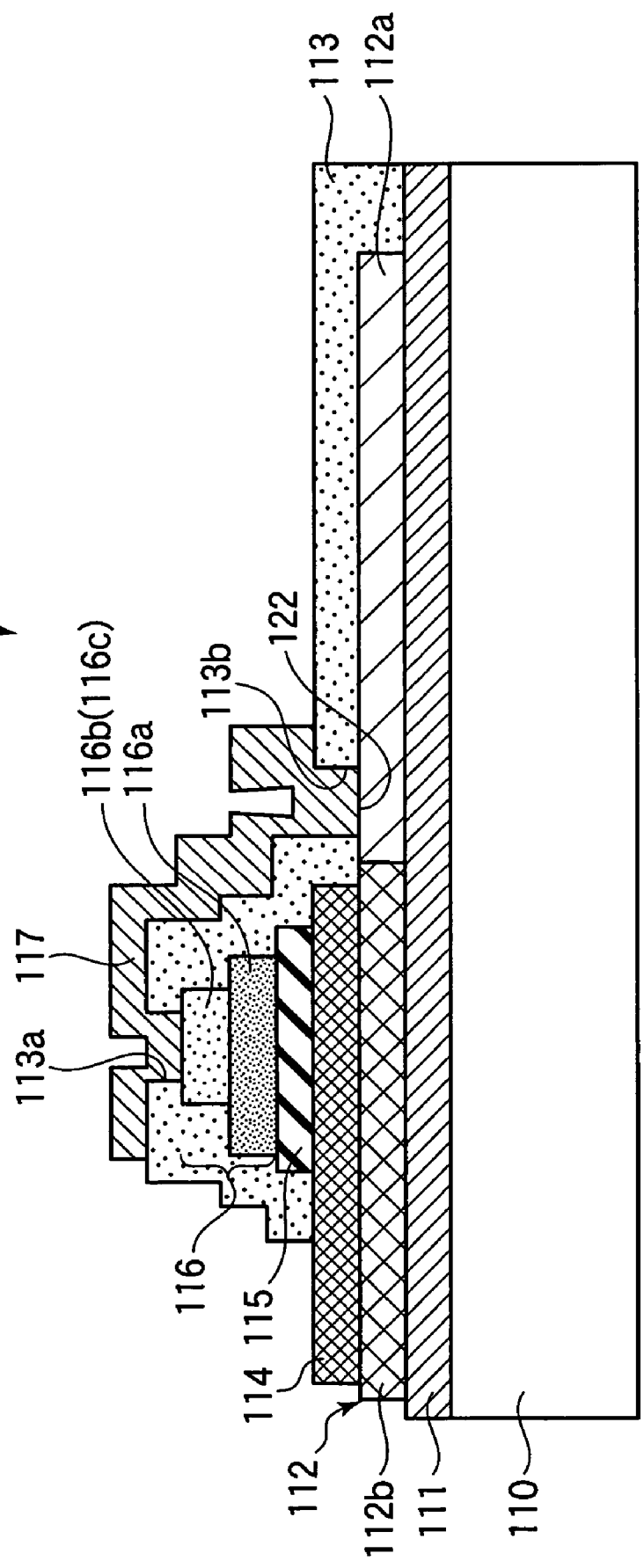
FIG. 14 is a cross sectional view taken along a line A-A of FIG. 13.

FIG. 13 is a top view of a semiconductor composite apparatus 101 according to a sixth embodiment. FIG. 14 is a cross sectional view taken along a line A-A of FIG. 13.

Referring to FIG. 14, the semiconductor composite apparatus 101 includes an Si substrate 110 on which a semiconductor device element region 111 is formed. The term "semiconductor device elements" means the impurity-implanted regions to form diodes, transistors, capacitors, resistors, inductors and other elements used in integrated circuits. The Si substrate 110 serves as the lowest layer (First substrate), and includes various elements such as diodes, transistors, resistors, and capacitors formed therein. These semiconductor elements constitute a digital or analog integrated circuit as a whole.

A wiring region 112 is formed on the semiconductor device element region 111. The wiring region 112 includes a first region 112a and a second region 112b. The first region 112a includes a multilayer wiring pattern that interconnects among elements formed in the element region 111 and between the element region 111 and external circuits. The second region 112b is formed at the same time that the wiring region 112 is formed. The film structure of the second region 112b is equivalent to that of the wiring region 112. The second region 112b may be formed of a dielectric layer having the same structure as the first region 112a without the metal layers.

A conductive layer 114 is, for example, a metal layer formed on the second wiring region 112b, and is in the form of a single layer, a stacked layer, a composite structure, or an alloy. The single layer, stacked layer, composite structure, or alloy contains one of Au, Ni, Ge, Pt, Ti, In, and Al. The conductive layer 114 is connected to an element or elements that constitute a semiconductor composite apparatus (e.g., driving integrated circuits) through wiring pads provided in the second wiring region 112b. In this case, the second region 112b may have metal wiring layers to connect the conductive layer 114. The conductive layer may also be electrically connected to the first region 112a by metal wires when the second region 112b has no metal layers. The conductive layers 114 may also be connected through wires, not shown, to the pads for electrical connection to an external circuit. A planarizing layer 115 is formed on the surface of the conductive layer 114. The planarizing layer 115 exhibits flatness sufficient such that the semiconductor thin film can be reliably bonded to the planarizing layer 115. The planarizing layer 115 is a layer of an organic conductive material, and is formed by coating, vapor deposition, or printing.

The conductive organic material for the planarizing layer 115 includes polyacetylene, polypyrrole, polythiophene, polyparaphenylene, poly p-phenylenevinylen, polynaphthylenevinylen, polyaniline, and polyethylene terephthalate. These materials may be doped with appropriate dopants. The dopants include halogens such as iodine (I) and bromine (Br), Lewis acids such as FeCl$_3$ and AsF$_5$, proton acids such as HNO$_3$, H$_2$SO$_4$, and HClO$_4$, transition metal halides, alkaline metals such as Li, Na, and K, and alkyammonium ion such as tetraethyl ammonium. Layers of organic materials, especially polymeric materials, are expected to exhibit good flatness.

A semiconductor thin film layer 116 is formed on the planarizing layer 115. The semiconductor thin film layer 116 is a single layer of GaAs, AlGaAs, AlGaInP, InP, GaP, GaInP, GaN, AlGaN, InGaN, and AlGaInAs, or a stacked structure formed of these materials and having various mixed crystal ratio. The stacked structure has a structure of, for example, n-GaAs/n-Al$_x$Ga$_{1-x}$As/n-Al$_y$Ga$_{1-y}$As/p-Al$_z$Ga$_{1-z}$As/p-GaAs where $0 \leq x, y, z \leq 1$, $y < x$, and $Y < z$.

The semiconductor thin film layer 116 is mesa-etched to form individual elements each of which has a pn junction. The semiconductor thin film layer 116 includes a lower region 116a, and an upper region 116b. The upper region 116b is divided into a plurality of upper structures 116c each of which serves as an element. The lower region 116a is, for example, n-GaAs/n-Al$_x$Ga$_{1-x}$As layer. The upper structure 116b includes at least a pn junction region and has a structure of, for example, n-Al$_y$Ga$_{1-y}$As/p-Al$_z$Ga$_{1-z}$As/p-GaAs. The configuration of the lower region 116a and upper structure 116b may be modified appropriately. For example, the lower region 116a may be n-GaAs and the upper structure 116b may be n-Al$_x$Ga$_{1-x}$As/n-Al$_y$Ga$_{1-y}$As/p-Al$_z$Ga$_{1-z}$As/p-GaAs. Still alternatively, the lower region 116a may be n-GaAs/n-Al$_x$Ga$_{1-x}$As and the upper structure 116b may be n-Al$_x$Ga$_{1-x}$As/n-Al$_y$Ga$_{1-y}$As/p-Al$_z$Ga$_{1-z}$As/p-GaAs.

In addition to AlGaAs, the semiconductor materials include AlGaInP, AlGaAsP, and nitrides such as AlGaN, GaN, AlInN, and InGaN. The nitride semiconductors include III-V-N type semiconductors such as GaAsN, GaPN, InAsN, InPN, InGaAsN, InPAsN, GaPAsN. The nitride semiconductors may also include I-VI Group such as ZnSe.

Output pads 122 are output terminals of the first wiring region 112a. An interlayer dielectric film 113 prevents the short-circuiting between individual wires and conductive layers, and is formed with openings 113a and 113b. Individual electrodes 117 are metal wires formed on the interlayer dielectric film 113 and interconnect between the upper structure 116c (contact layer on the pn junction element) and the output pads 122 through the openings 113a and 113b. The individual electrodes 117 are formed of, for example, Ti/Pt/Au, AuGe/Ni/Au, Ti/Pt/Al, Ni/Al, AlSiCu, or TiN. It is to be noted that the combination of the lower region 116a and the upper structure 116c forms a semiconductor element according to the sixth embodiment.

The conductive layer 114 supplies, for example, a ground potential to the respective semiconductor elements in the semiconductor thin film layer 116. Thus, the conductive layer 114 is connected to the ground through electrode pad, not shown, of the substrate or the ground lines of the integrated circuit.

Referring to FIG. 13, the first wiring region 112a and second wiring region 112b extend in a longitudinal direction of the semiconductor composite apparatus 101. The conductive layer 114 extends on the second wiring region 112b. The planarizing layer 115 extends on the conductive layer 114. The semiconductor thin film layer 116 extends on the planarizing layer 115. The layers 114, 115, and 116 extend in the longitudinal direction of the semiconductor composite apparatus 101. The lower region 112a lies under or below the pn junctions. The upper region 116b lies on the lower region 116a and includes at least the pn junction. The upper region 116b is mesa-etched to define a plurality of upper structures 116c that serve as an individual element.

FIG. 13 illustrates the lower region 116a as a common region to the plurality of upper structures 116c. For illustrating the features of the sixth embodiments more clearly, the interlayer dielectric film 113 is omitted. The lower region 116a may also be mesa-etched into individual regions. A common electrode may be formed and is electrically connected to all the individual elements (FIG. 13) for static operation of the light emitting elements. The common electrode may be divided into a plurality of electrode groups and the plurality of electrode groups, and individual electrodes may be formed so that the light emitting elements can be matrix-driven. The individual electrodes 117 may be in the form of a transparent conductive thin film instead of a metal thin film. As shown in FIG. 12, the individual electrodes 117 may be a combination of the transparent conductive film and metal thin film.

The semiconductor element according to the sixth embodiment is an LED. A plurality of upper structures 116c that serve as a light emitting region are formed and aligned in a longitudinal direction of the semiconductor composite apparatus 101. The output pads 122 are formed in the first wiring region 112a, each of the output pads 122 being located adjacent to a corresponding one of the plurality of upper structures 116c. Input pads 121 are formed within the first wiring region 112a, and receive signals and electric power from external circuits. The individual electrodes 117 interconnect between the plurality of upper structures 116c and the output pads 122.

The operation of the semiconductor composite apparatus 101 will be described.

The signals and electric power are supplied to the semiconductor composite apparatus 101 through the input pads for driving the LEDs in the semiconductor thin film layer 116. The output pads of the integrated circuits supplies individual drive currents to the LEDs, thereby controllably energizing the LEDs. The potential common to the LEDs is supplied through the conductive layer 114 and planarizing conductive layer 115 to the lower region 116a of the semiconductor thin film layer 116.

The method of manufacturing the semiconductor composite apparatus 101 will be described.

The semiconductor thin film layer 116 is made by growing an epitaxial layer on a second substrate, not shown. A structure of n-GaAs/n-Al$_x$Ga$_{1-x}$As/n-Al$_y$Ga$_{1-y}$As/p-Al$_z$Ga$_{1-z}$As/p-GaAs is formed on the second substrate of GaAs. A release layer of AlAs is provided between the substrate of GaAs and the semiconductor thin film layer 116 of (n-GaAs/n-Al$_x$Ga$_{1-x}$As/n-Al$_y$Ga$_{1-y}$As/p-Al$_z$Ga$_{1-z}$As/p-GaAs).

In this manner, the semiconductor thin film layer 116 is formed on the second substrate with the sacrifitial layer lying between the second substrate and semiconductor thin film layer 116. Then, this sacrifitial layer is removed by selectively etching with diluted hydrochloride acid or hydrofluoric acid, so that the semiconductor thin film layer 116 is lifted off from the second substrate (GaAs substrate). A supporting material may be provided to protect the semiconductor thin film layer 116 during the lift-off process and facilitate the handling of the semiconductor thin film layer during the bonding process of the semiconductor thin film on the first substrate.

An integrated circuit includes the element region 111 and the wiring region 112, and controllably drives the light emitting elements formed on the Si substrate 110 (FIG. 12). The first wiring region 112a and second wiring region 112b are formed on the element region 111 and the wiring region 112 and interconnect various elements to form the integrated circuit as a whole. The conductive layer 114 is formed on the second wiring region 126b. The planarizing layer 115 is formed on the conductive layer 114. If the planarizing layer 115 is to be formed of a conductive organic material of low-molecular substance, the planarizing layer 115 may be formed by deposition. If the planarizing layer 115 is to be formed of a conductive organic material of high-molecular substance, the planarizing layer 115 may be formed by coating (spin coat), printing (screen printing or ink jet), or doctor blade method.

If the planarizing conductive layer 115 is to be formed of a metal oxide such as ITO or ZnO, the planarizing conductive layer 115 may be formed by sputtering or ion plating. If the planarizing conductive layer 115 is to be formed of a conductive metal oxide such as Cu, Sr, Bi, Ca, Y, or Rb, sputtering may be employed. If the planarizing conductive layer 115 is to be formed of a metal layer, hot-wall method, sputtering, or electron beam deposition may be used. The thickness f the planarizing conductive layer 115 may be in the range of 50 to 5000 nm. The specific resistance of the planarizing conductive layer may be in the range of $5 \times 10^{-3}$ ohms.

If a current of 1 mA flows through the planarizing conductive layer 115 of 1 μm thick, 50 μm wide, and 50 μm long, a voltage drop across the planarizing conductive layer 115 is 0.05 V, which is too small to affect the drive voltage Vf for driving the LEDs. The smaller the thickness, the higher the voltage Vf. The larger the thickness, the larger the stress.

The pattern of the individual electrodes 117 is formed by standard lift-off process or photolithography/etching. In patterning by etching, a hydrochloric acid etchant may be used for ITO. For patterns formed of conductive metal oxides that contain Cu, Sr, Bi, Ca, Y or Rb, etching may be carried out by photolithography/etching or lift-off process that use an etchant such as hydrofluoric acid or hydrochloric acid. The optimum conditions under which the planarizing conductive layer 115 is formed should be such that the planarizing conductive layer 115 has a desired flatness after formation of thin film.

After forming the planarizing conductive layer 115, sinter is performed for reducing electrical contact resistance. If the planarizing conductive layer 115 is formed of a metal oxide, sinter is performed to reduce the specific resistance of the planarizing conductive layer 115. Sinter temperature should be selected such that the conductive layer 114, the semiconductor elements in the element region 111, and planarizing conductive layer 115 are not damaged. The sinter temperature is, for example, not higher than 300° C. for the planarizing conductive layer 115 formed of a conductive organic material, and not higher than 500° C. for the planarizing conductive layer 115 formed of a metal oxide.

As described above, the semiconductor thin film layer 116 is first formed on the second substrate (GaAs substrate), not shown, and is then separated from the second substrate. Then, the semiconductor thin film layer 116 is then bonded onto the planarizing conductive layer 115 on a first substrate, and is then sintered at a temperature in the range of 100-400° C. for 1-3 hours to ensure necessary bonding strength and electrical contact between the semiconductor thin film layer 116 and the planarizing conductive layer. Then, etching is performed to divide the upper region 116 into individual elements, thereby forming the plurality of upper structures 116c. The upper structures 116c corresponds to the semiconductor element LEDs.

FIG. 15 illustrates a modification to the semiconductor composite apparatus 101. Another planarizing layer 118 having an opening 118a may be formed between the conductive layer 114 and the wiring region 112. The planarizing layer 118 is in the form of a dielectric film of an organic material, an oxide, or a nitride. The conductive layer 114 is in electrical contact with the second wiring region 112b through the opening 118a.

FIG. 16 illustrates a second modification to the semiconductor composite apparatus 101. In this modification, the conductive layer 114 is omitted and the planarizing conductive layer 115 extends to the second wiring region 112b.

FIG. 17 illustrates a third modification to the semiconductor composite apparatus 101. Another planarizing layer 118 having an opening 118a may be provided between the conductive layer 114 and the planarizing conductive layer 115. The planarizing layer 118 is in the form of a dielectric film of an organic material, an oxide, or a nitride. The conductive layer 115 is in electrical contact with the conductive layer 114 through the opening 118a.

FIG. 18 illustrates a fourth modification to the semiconductor composite apparatus 101. A metal layer 119 may be provided between the semiconductor thin film layer 116 and the planarizing conductive layer 115. For example, a metal thin film (e.g., AuGe/Ni/Au or Ti/Pt/Au) is formed on the back surface of the semiconductor thin film layer (e.g., AlGaAs) and the semiconductor thin film layer is bonded onto the planarizing conductive layer 115. Alternatively, a metal layer may be formed on the planarizing conductive layer 115 and then the semiconductor thin film layer is bonded onto the metal layer. When the semiconductor thin film layer 116 is a GaN semiconductor thin film, aluminum or titanium/aluminum may be used for the metal thin film layer 119 in contact with a p-type layer. When the semiconductor thin film layer 116 is a GaN semiconductor thin film, gold, platinum, or nickel may be used for the metal thin film 119 in contact with an n-type layer. These metal layers may be made as thin as the metal layer is translucent.

Further modifications may be made. In FIG. 18, the planarizing conductive layer 115 may be used in place of the conductive layer 114. The element region 111 and the second wiring region 112b may be omitted and the conductive layer 114 may be formed on the substrate 110. As described above, the thin film structure under the semiconductor thin layer 116 may be changed or omitted as required.

The sixth embodiment provides the following advantages. Because the semiconductor thin film is bonded on the conductive thin layer having a good flatness, adhesion of the semiconductor thin film is excellent. Because an ohmic contact is made on the back surface of the semiconductor thin film, the wiring pattern may be simplified and the size of the semiconductor thin film may be small.

The planarizing conductive in the form of a conductive organic material offers the following advantages.

Organic material, especially polymer, as a material for thin film adheres to the surface to which the thin film is attached. Thus, the organic material is effective in reducing the surface roughness and increases adhesion. Further, use of a material that absorbs little or no light increases transmission of light emitted from the light emitting element. Such a material exhibits a large forbidden band (HOMO-LUMO) at the energy of light emitted from the LED. HOMO stands for the highest occupied molecular orbital level. LUMO stands for the lowest unoccupied molecular orbital level. Thus, the light reflected by a highly reflective layer formed beneath the planarizing layer passes through the planarizing layer without significant loss of power of light.

The planarizing conductive layer in the form of a transparent oxide layer provides the following advantages. Because the surface of the planarizing conductive layer is an oxide layer, the surface is hydrophilic. High adhesion is obtained with the presence of moisture between bonded surfaces. Because the planarizing conductive layer is transparent, the light emitted from the semiconductor thin film layer transmits in the direction opposite to the light emitting opening and is reflected back by the conductive layer (metal layer) to the light emitting opening. Thus, efficient utilization of light is ensured while also maintaining good adhesion of the semiconductor thin film to the substrate.

When the planarizing conductive layer takes the form of a metal layer, the metal layer has a mirror-like surface that exhibits a small scattering of light and a high reflection coefficient.

The conductive layer 114 is provided under the planarizing conductive layer 115. The common potential is supplied to the conductive layer 114 through electrode pads on the substrate, not shown, or the ground line of the integrated circuit. The invention is not limited to this configuration, but, for example, the common potential may be supplied directly to the planarizing conductive layer 115, in which case the conductive layer 114 may be omitted. If the planarizing conductive layer 115 is a transparent layer, a reflection layer may be formed directly under the planarizing conductive layer 115 to maintain a high light power.

Seventh Embodiment

Figure 19A:
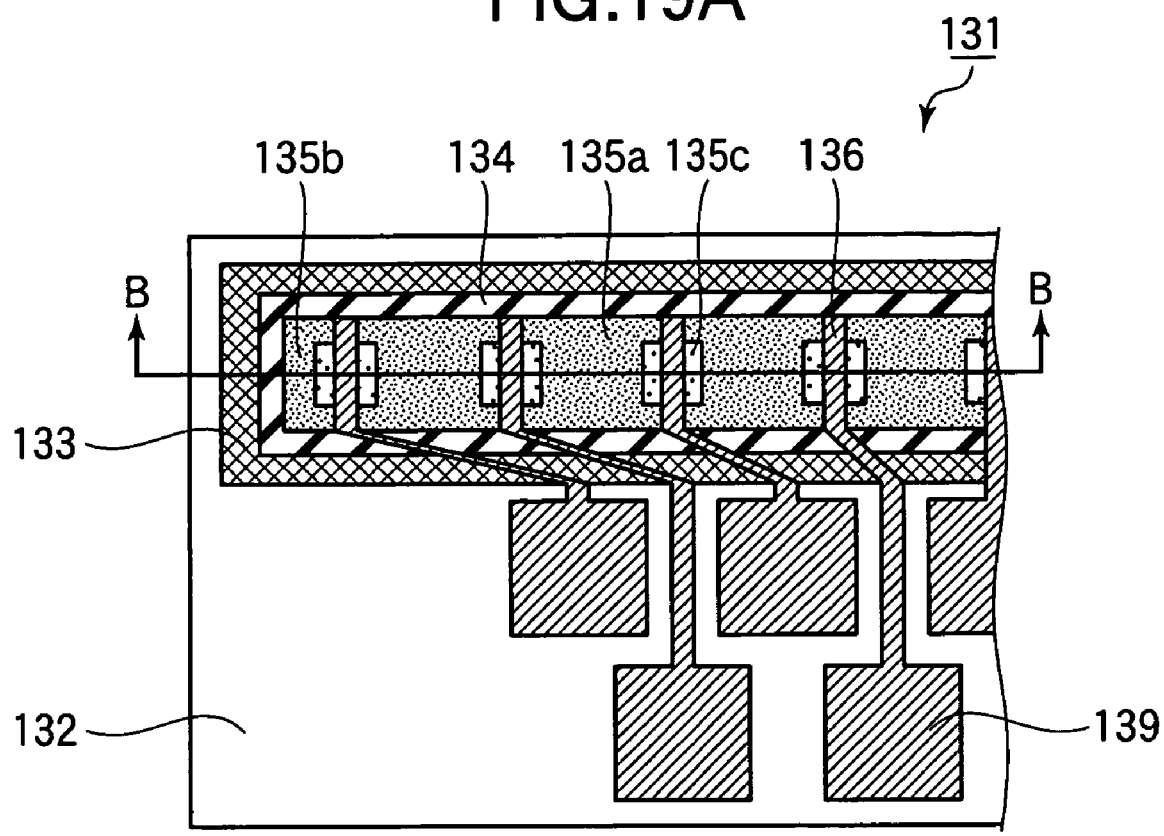
FIG. 19A is a top view of a semiconductor composite apparatus according to a seventh embodiment.
Figure 19B:
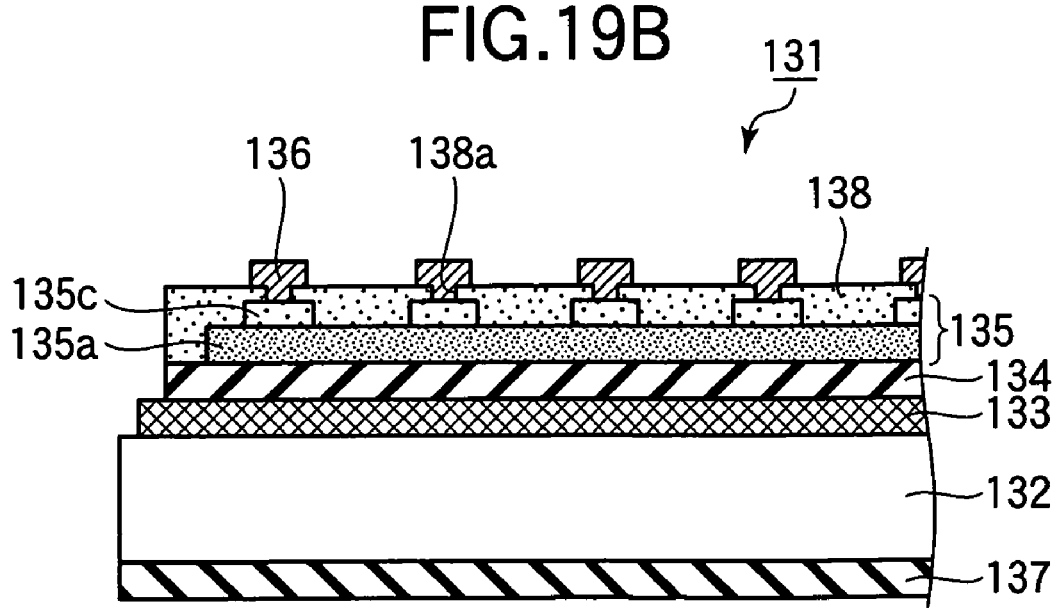
FIG. 19B is a cross sectional view taken along a line B-B of FIG. 19A.

FIG. 19A is a top view of a semiconductor composite apparatus 131 according to a seventh embodiment. FIG. 19B is a cross sectional view taken along a line B-B of FIG. 19A.

The semiconductor composite apparatus 131 differs from the semiconductor composite apparatus 101 according to the first embodiment (FIG. 13) in that the element region 111 (FIG. 14) and the wiring region 112 (FIG. 14) are not used and electrode pads 139 and electrode contacts 136 are provided.

Referring to FIG. 19B, the semiconductor composite apparatus 131 includes a conductive layer 133 formed on an Si substrate 132 (first substrate). The conductive layer 133 is a single metal layer, a stacked-layer structure, a composite structure or an alloy, which contains one of Au, Ni, Ge, Pt, Ti, In, and Al. The planarizing conductive layer 134 is formed on the conductive layer 133. The planarizing conductive layer 134 is a layer of a conductive organic material, and is formed by coating, vapor deposition, or printing. The organic materials include those described in the sixth embodiment. Layers of organic materials, especially polymeric materials, are expected to exhibit good flatness.

The planarizing conductive layer 134 may be a layer of a transparent conductive material or a metal. The transparent conductive layer may be formed of indium/tin oxide (ITO), zinc oxide (ZnO), or a conductive metal oxide containing Cu, Sr, Bi, Ca, Y, or Rb. The metal layer may be formed of Ti, Ni, Cr, or Ge. The planarizing conductive layer 134 is preferably formed of an electrically conductive material having a sufficient flatness after formation of the metal layer. This electrically conductive material allows the semiconductor thin film to be bonded to the surface with good adhesion. Alternatively, after formation of the metal layer on the substrate 132, the planarizing conductive layer 134 may be made sufficiently flat by chemical surface treatment (e.g., etching), mechanical surface treatment (lapping), or chemical-mechanical polishing (CPM) so that the semiconductor thin film can be bonded with good adhesion. The semiconductor thin film layer 135 is arranged to bond on the planarizing conductive layer 134.

The semiconductor thin film layer 135 is of the same configuration as the semiconductor thin film layer 116 according to the sixth embodiment. The semiconductor thin film layer 135 is selectively etched into individual elements having a pn junction. The semiconductor thin film layer 135 includes a lower region 135a (correspond to 116a), and an upper region 135b (corresponds to 116b). The upper region 135b is divided into a plurality of upper structure 135c which are individual elements.

The method for manufacturing the semiconductor thin film layer 135 and the method for bonding the semiconductor thin film layer 135 onto the planarizing conductive layer 134, and the method for achieving the planarizing conductive layer 134 having a flat surface are the same as those in the sixth embodiment.

A common electrode 137 is formed on the underside of the Si substrate 132. The common electrode 137 and conductive layer 133 are preferably in ohmic contact with each other on the surface of the substrate 132 (first substrate).

The interlayer dielectric film 138 (FIG. 19B) covers these layers, and a plurality of electrode pads 139 are formed on the interlayer dielectric film 138. The interlayer dielectric film 138 is formed with openings 138a therein in alignment with the upper structures 135c. The electrode contact 136 extends through the opening 138a and connects between an electrode pad 139 and a corresponding upper structure 135c. The electrode pads 139 are connection pads (wire bonding pad) for connecting the semiconductor thin film layer to an external drive circuit.

In the seventh embodiment, the conductive layer 133 is formed on the conductive Si substrate 132, and the planarizing conductive layer 134 is formed on the conductive layer 133. Alternatively, the planarizing conductive layer 134 may be provided directly on the Si substrate 132. The planarizing conductive layer 134 needs to lie at least under the semiconductor thin film layer 135 or under a semiconductor element (e.g., LED) in the semiconductor thin film layer 135, and may extend to other areas. The conductive layer 133 or planarizing conductive layer 134 may be formed on, for example, an integrated circuit with an interlayer dielectric film or another planarizing layer formed between the integrated circuit and the conductive layer 133 or planarizing conductive layer 134. Openings for wiring purposes may be formed at appropriate locations. A conductive layer such as a metal thin film layer may be formed between the semiconductor thin film layer 135 and the planarizing conductive layer 134. Further, other types of substrates including a compound semiconductor substrate, a metal substrate, a conductive organic substrate, and a conductive glass may be used in place of the conductive Si substrate.

As described above, the semiconductor composite apparatus according to the seventh embodiment provides the same advantages as the sixth embodiment. In addition, electrode pads provided for connecting to an external circuit are also useful when the semiconductor composite apparatus has no integrated circuit therein.

Eighth Embodiment

Figure 20:
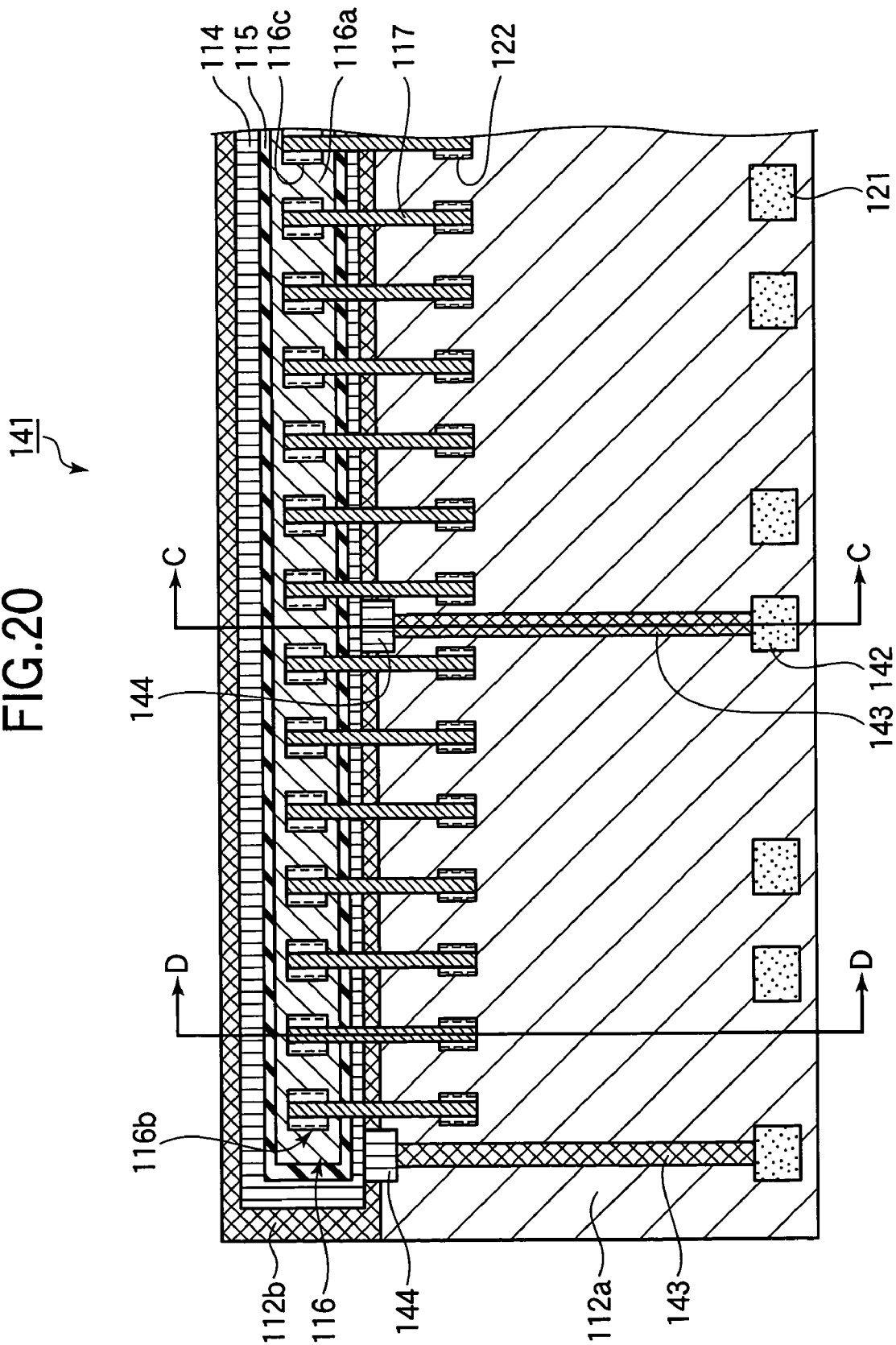
FIG. 20 is a top view illustrating a semiconductor composite apparatus according to an eighth embodiment.
Figure 21:
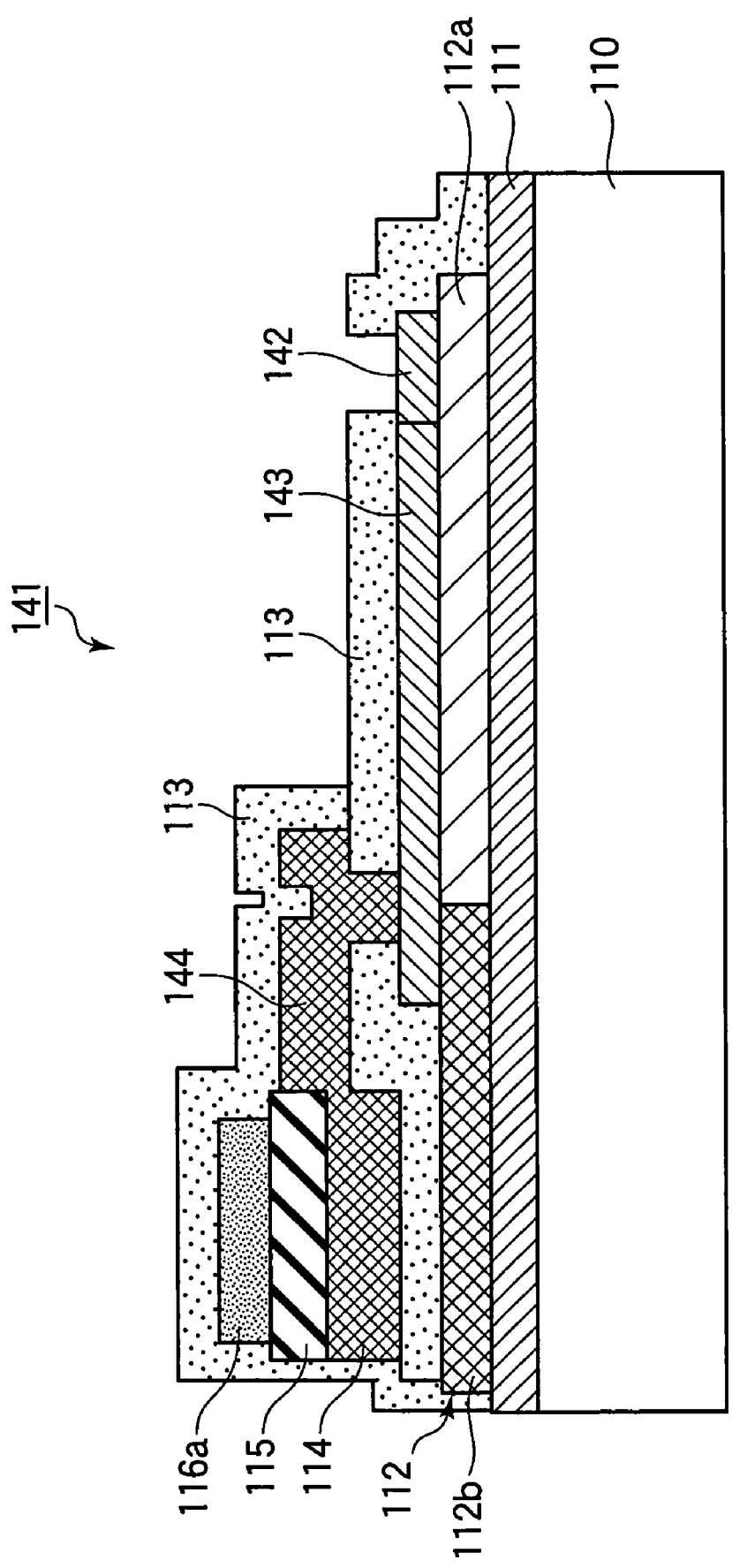
FIG. 21 is a cross sectional view taken along a line C-C of FIG. 20.
Figure 24:
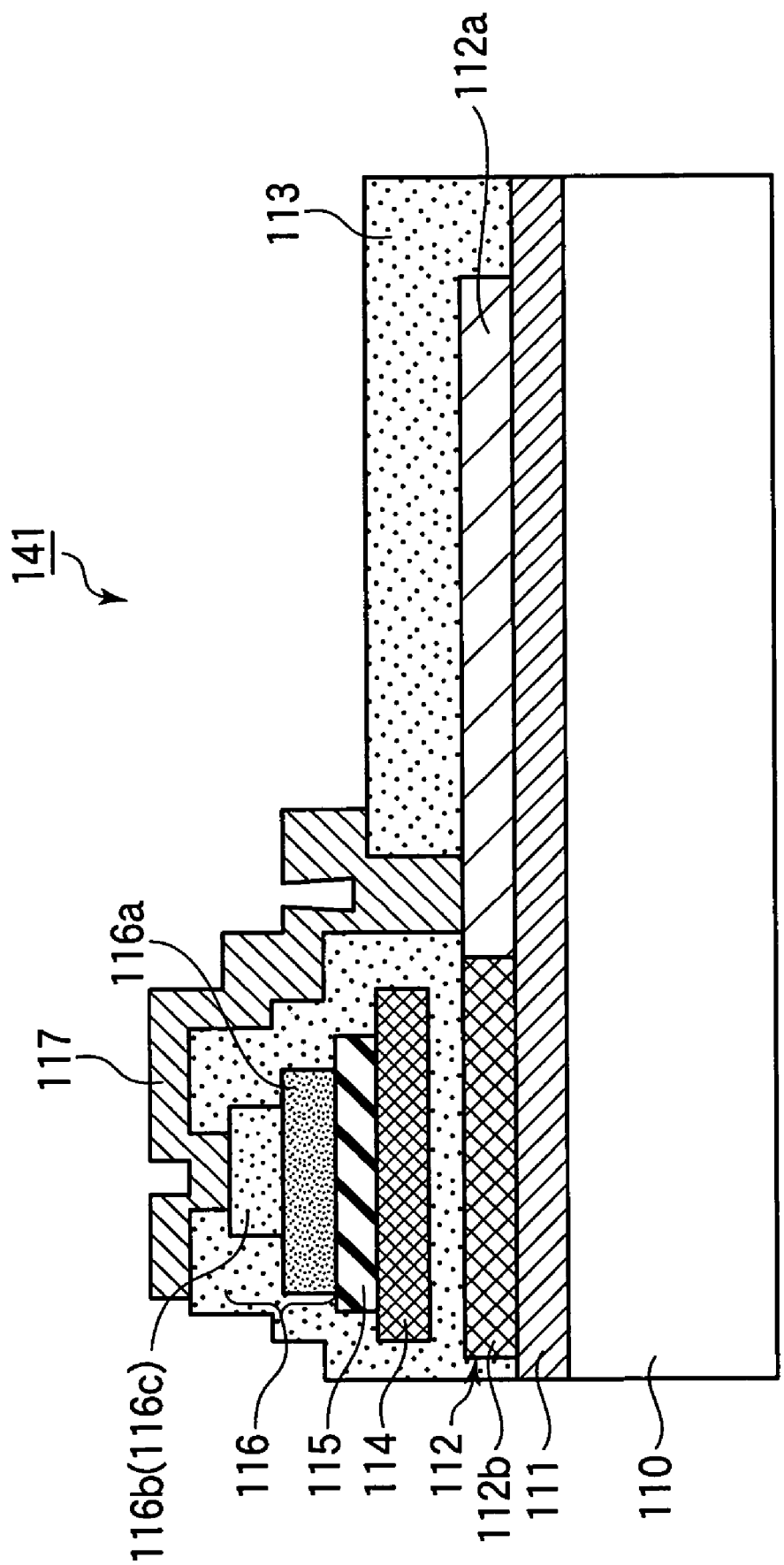
FIG. 24 is a cross sectional view taken along a line D-D of FIG. 20.

FIG. 20 is a top view illustrating a semiconductor composite apparatus 141 according to an eighth embodiment. FIG. 21 is a cross sectional view taken along a line C-C of FIG. 20. FIG. 24 is a cross sectional view taken along a line D-D of FIG. 20. For illustrating the features of the eighth embodiment more clearly, FIG. 20 shows the semiconductor composite apparatus 141 with an interlayer dielectric film 113 (FIG. 21) omitted. The interlayer dielectric film 113 prevents short-circuits between wires and conductive layers.

The semiconductor composite apparatus 141 differs from the semiconductor composite apparatus 101 according to the sixth embodiment in that electrode pads 142 are provided at a plurality of locations for connecting to the conductive layer 114 through a conductive wiring layer 143. Elements similar to those of the sixth embodiment have been given the same reference numerals and their description if omitted.

The cross section (FIG. 20) of the semiconductor composite apparatus 141 has substantially the same stacked structure as the cross section of the semiconductor composite apparatus 101.

Referring to FIG. 21, a wiring region 112 is formed on the element region 111 and extends in a longitudinal direction (i.e., perpendicular to the paper). The wiring region 112 includes a first wiring region 112a and a second wiring region 112b. An electrode pad 142 is formed on the first wiring region 112a. An upper structure 116c is formed on the second wiring region 112b. The conductive wiring layers 143 extend in a direction perpendicular to the longitudinal direction of the semiconductor composite apparatus 141, and lies between the first electrode 142 and the upper structure 116c. One end of the conductive wiring layer 143 is in contact with one end of a wiring layer 144. The wiring layer 144 is electrically continuous to the conductive layer 114. The conductive wiring layer 143 and wiring layer 144 are in the form of a metal layer.

The conductive layers 143 pair up with the corresponding electrode pads 142 and, the pairs are aligned at predetermined intervals in the longitudinal direction of the semiconductor composite apparatus 141. Ground potential is supplied to the electrode pads 142 from an external circuit.

For example, current is supplied to the upper structures 116c in the semiconductor thin film layer 116 that serve as a light emitting region. The current is supplied in the same manner as in the sixth embodiment. A common potential, e.g., ground potential is supplied to the conductive layer 114 through the electrode pads 142 and conductive wiring layers 143. This arrangement prevents potential changes from occurring due to voltage drop within the conductive layer 114.

The method of fabricating the thus configured semiconductor composite apparatus 141 will be described. The method of fabricating the semiconductor thin film layer 116 is the same as that in the sixth embodiment.

The planarizing conductive layer 115 is a layer of a conductive organic material formed by coating, vapor deposition, or printing. The conductive organic materials include those described in the sixth embodiment. Layers of organic materials, especially polymeric materials, are expected to exhibit good flatness.

Another example of a planarizing conductive layer may be a layer of a transparent conductive material or a layer of metal. The transparent conductive layer may be formed of indium/tin oxide (ITO), zinc oxide (ZnO), or a conductive metal oxide containing Cu, Sr, Bi, Ca, Y, or Rb. The metal layer may be formed of Ti, Ni, Cr, or Ge. The planarizing conductive layer 115 is preferably formed of an electrically conductive material having a sufficient flatness after formation of the metal layer. This electrically conductive material allows the semiconductor thin film to be bonded to the surface with good adhesion. Alternatively, after the metal layer is formed on the substrate, the metal layer may be made sufficiently flat by chemical surface treatment (e.g., etching), mechanical surface treatment (e.g., lapping), or chemical-mechanical polishing (CPM) so that the semiconductor thin film can be bonded with good adhesion.

If the planarizing conductive layer 115 is to be formed of zinc oxide (ZnO), the ZnO film may be formed by ion plating. The planarizing conductive layer 115 formed of ZnO is a transparent film. ZnO film is preferably formed at a low temperature, e.g., room temperature. Forming the ZnO film at room temperature prevents damage to the conductive layer 114 and the elements in the element region 111. The ZnO may be patterned by standard photolithography/etching after formation of the ZnO film. Buffered hyrofluoric acid may be used as an etchant. The ZnO film pattern may also be formed by lift-off process just as in the sixth embodiment.

The semiconductor thin film layer 116 formed on another substrate (second substrate). The semiconductor thin film layer 116 is then lifted off from the substrate and then bonded onto the planarizing conductive layer 115 on the substrate 110 (first substrate). The semiconductor thin film layer 116 and the substrate 110 are sintered at a temperature not higher than 500° C., more specifically in the range of 100-400° C. for 1-3 hours, thereby obtaining necessary adhesion and electrical contact between the semiconductor thin film layer 116 and the planarizing conductive layer 115. The upper region 116b is divided by etching into a plurality of upper structure 116c which are individual elements. The upper structure 116c corresponds to an LED.

In the eighth embodiment, the upper structure 116c and the output pad 122 are connected through the individual electrodes 117. If the semiconductor composite apparatus 141 does not contain integrated circuits therein, connection pads may be used for connecting the semiconductor thin film layer (the upper structure 116c) to an external drive circuit.

Figure 22:
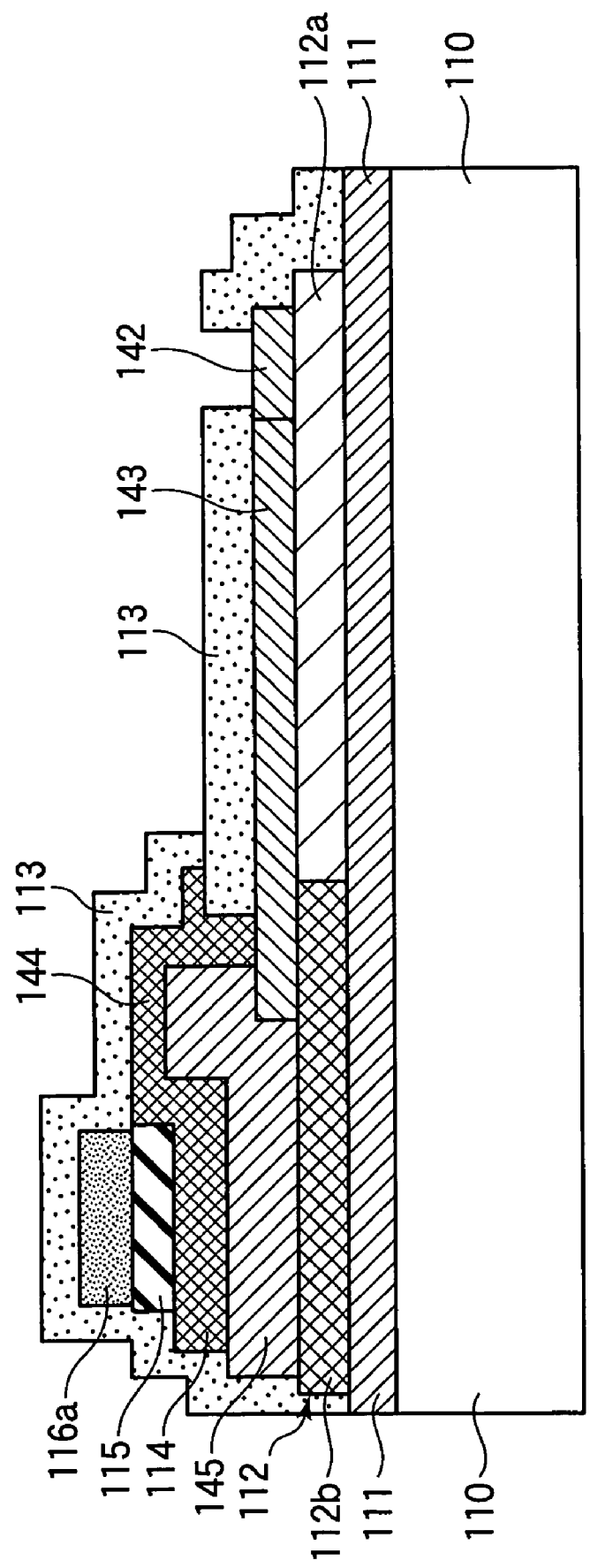
FIG. 22 illustrates a first modification to the semiconductor composite apparatus.

FIG. 22 illustrates a first modification to the semiconductor composite apparatus 141. Referring to FIG. 22, another planarizing layer 145 is formed under the conductive layer 114. The planarizing layer 145 may be an organic layer such as polyimide, an oxide film such as $Al_2O_3$ or $SiO_2$, or a nitride film such as $Si_xN_y$.

Figure 23:
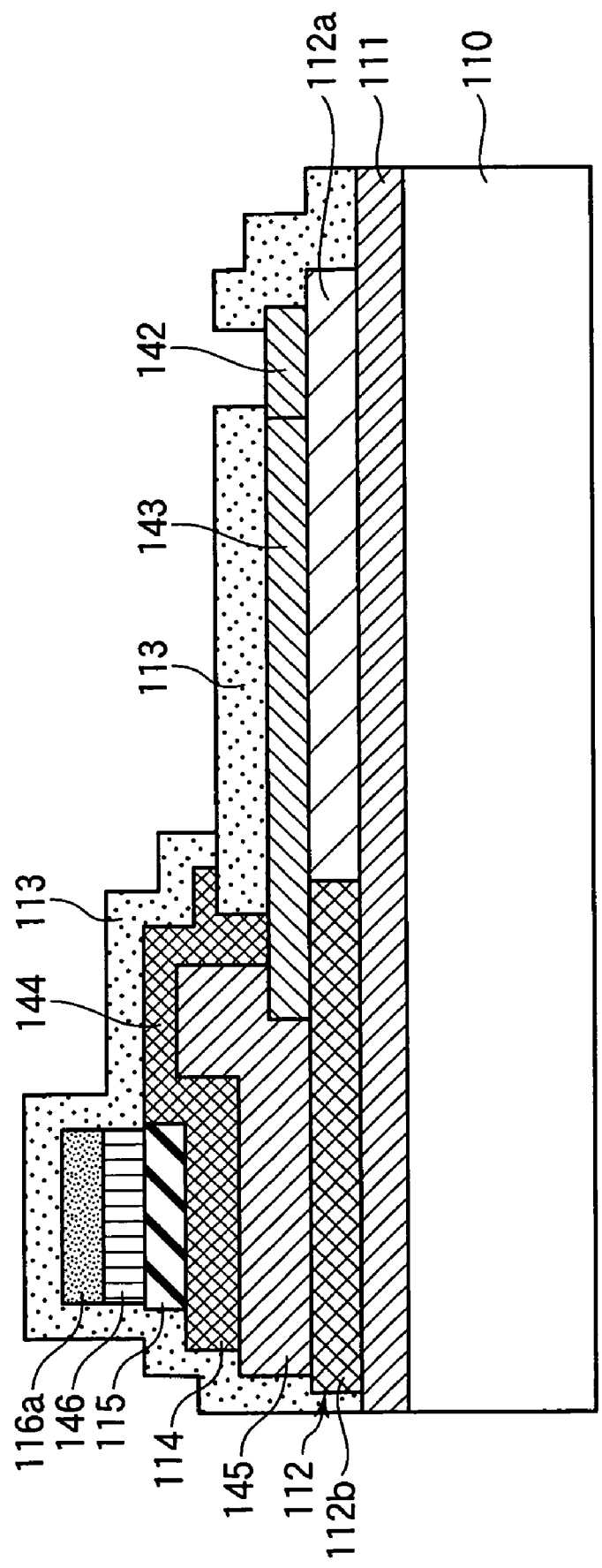
FIG. 23 illustrates a second modification to the semiconductor composite apparatus according to the eighth embodiment.

FIG. 23 illustrates a second modification to the semiconductor composite apparatus 141. Referring to FIG. 23, a conductive layer 146 is provided between the semiconductor thin film layer 116 and the planarizing conductive layer 115. Instead of using the conductive layer 114, the planarizing conductive layer 115 may be connected directly to the conductive wiring layer 143.

With the semiconductor composite apparatus 141 according to the eighth embodiment, the common potential, e.g., ground potential, is supplied to the conductive layer 114 at a plurality of locations. This arrangement prevents potential changes from occurring due to voltage drop at the lower region 116a even if the planarizing conductive layer 115 has a relatively high sheet-resistance or a reduced thickness. Therefore, the power of light emitted from the light emitting elements may be consistent.

If the planarizing conductive layer 115 is formed of zinc oxide (ZnO), the ZnO film may be formed at room temperature. Forming the ZnO film at room temperature prevents damage to the conductive layer 114 and the elements in the element region 111, which would otherwise caused by heat.

Ninth Embodiment

Figure 25:
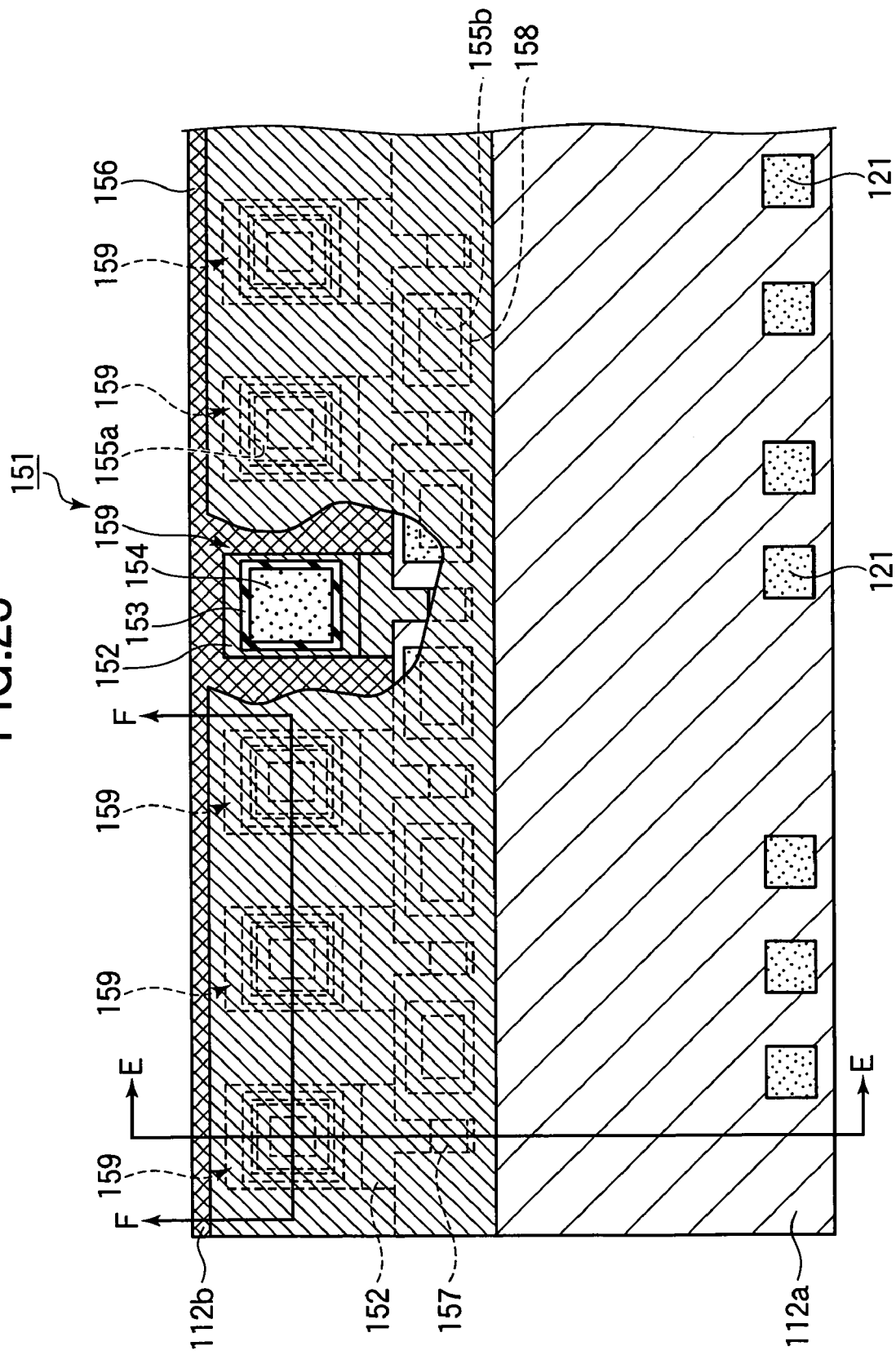
FIG. 25 is a top view illustrating a semiconductor composite apparatus according to a ninth embodiment.
Figure 26:
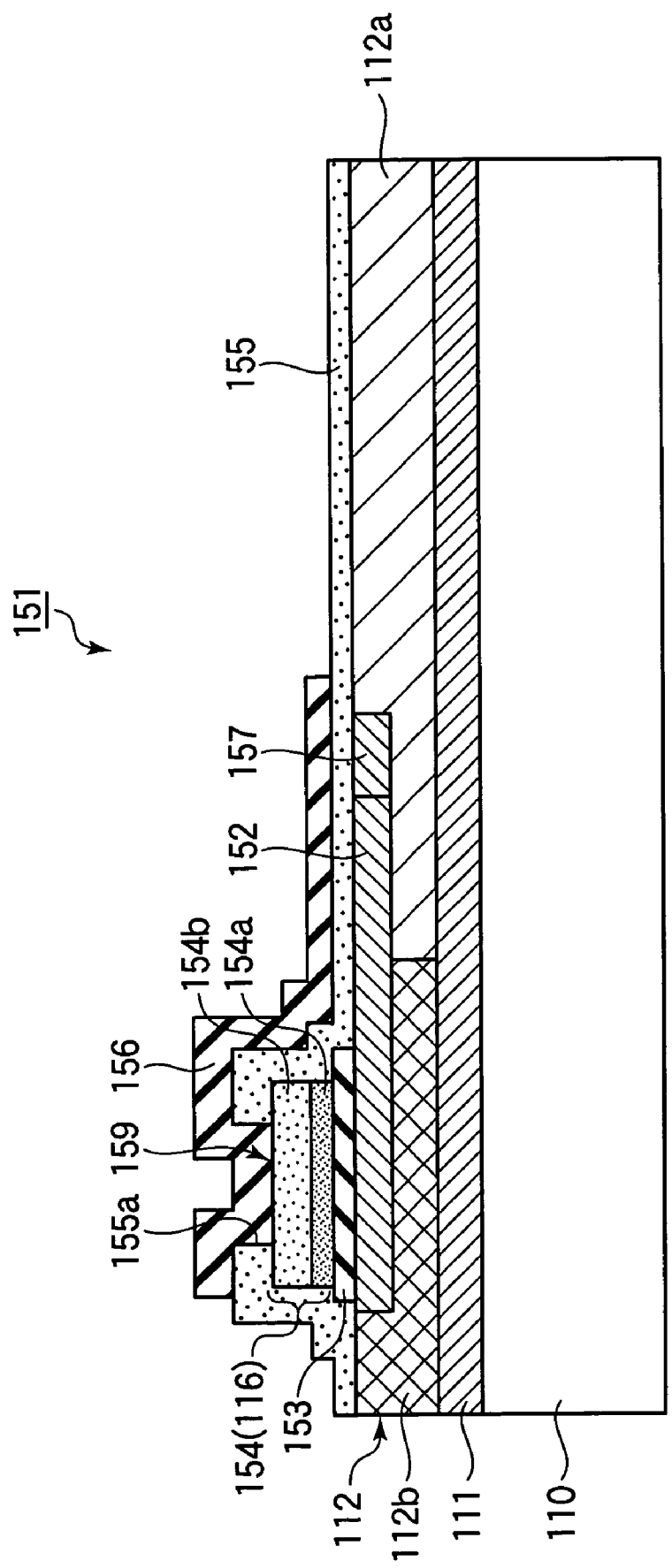
FIG. 26 is a cross sectional view taken along a line E-E of FIG. 25 illustrating one of a plurality of individual semiconductor regions.
Figure 27:
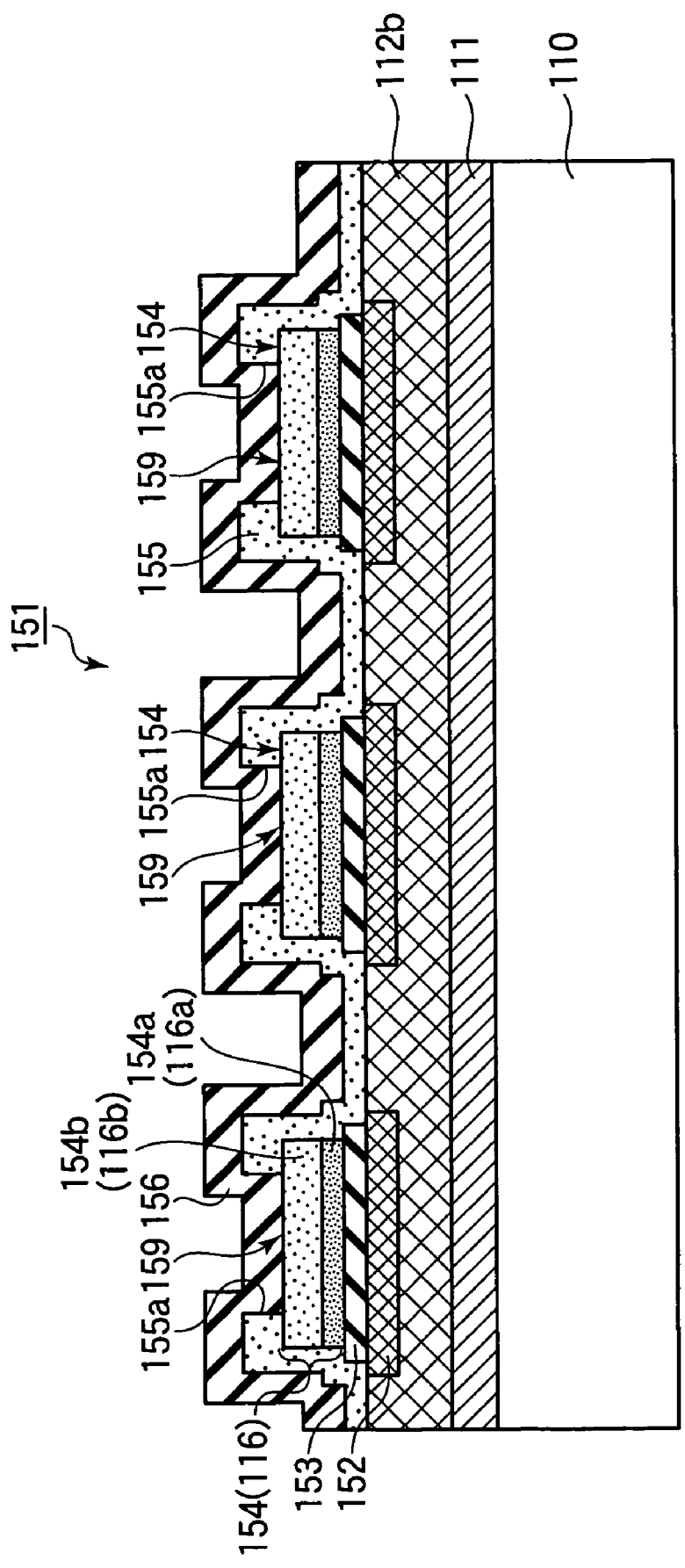
FIG. 27 is a cross sectional view taken along a line F-F of FIG. 25.

FIG. 25 is a top view illustrating a semiconductor composite apparatus 151 according to a ninth embodiment. FIG. 26 is a cross sectional view taken along a line E-E of FIG. 25 illustrating one of a plurality of individual semiconductor regions 159. FIG. 27 is a cross sectional view taken along a line F-F of FIG. 25.

For illustrating the features of the ninth embodiment more clearly, FIG. 25 shows the semiconductor composite apparatus 151, omitting an interlayer dielectric film 155 (FIG. 26) that prevents short-circuits between wires and conductive layers, and partly omitting a transparent conductive film layer 156. Reference numerals 116, 116a, and 116b denote a semiconductor thin film layer, a lower region of the semiconductor thin film layer, and an upper region of the semiconductor thin film layer, respectively, before the semiconductor thin film layer 116 is etched into individual semiconductor elements 154.

The semiconductor composite apparatus 151 differs from the semiconductor composite apparatus 101 according to the sixth embodiment in that the lower region 116a, a planarizing conductive layer 153 (corresponds to planarizing conductive layer 115 in FIG. 13), and individual conductive layers 152

(corresponds to conductive layer 114 in FIG. 13) are divided into individual elements, and therefore current is supplied through different paths to the individual regions. Elements similar to those of the sixth embodiment have been given the same reference numerals and their description is omitted.

Referring to FIG. 26, each of the plurality of individual semiconductor regions 159 includes the individual conductive layer 152 formed on a wiring region 112, the planarizing conductive film layer 153, and the semiconductor element 154, which are stacked in this order.

The individual conductive layer 152 has a region which is electrically connected to the output pad 157 formed in the wiring region 112a, thereby providing a path for a control signal for controllably energizing a corresponding semiconductor element 154. The planarizing conductive layer 153 is a layer of conductive organic material formed by coating, vapor deposition, or printing. The conductive organic materials for the planarizing conductive layer 153 are, for example, those in the sixth embodiment. Layers of organic materials, especially polymeric materials, are expected to exhibit good flatness.

The planarizing conductive layer 153 may be a layer of a transparent conductive material or a layer of metal. The transparent conductive material may be formed of indium/tin oxide (ITO), zinc oxide (ZnO), or a conductive metal oxide containing Cu, Sr, Bi, Ca, Y, or Rb. The metal layer may be formed of Ti, Ni, Cr, Ge, or Pd. The planarizing conductive layer 153 is preferably formed of an electrically conductive material having a sufficient flatness after formation of the metal layer. This electrically conductive material allows the semiconductor thin film to be bonded to the surface with good adhesion. Alternatively, after the metal layer is formed on the substrate 132, the metal layer may be made sufficiently flat by chemical surface treatment (e.g., etching), mechanical surface treatment (lapping), or chemical-mechanical polishing (CPM) so that the semiconductor thin film can be bonded with good adhesion.

When the semiconductor thin film layer 116 is mesa-etched into the semiconductor elements 154, the lower region 116a and upper region 116b of semiconductor thin film layer 116 are divided into a plurality of lower structures 154a and a plurality of upper structures 154b, respectively. Each of the semiconductor elements 154 is a combination each of the plurality of lower structures 154a and a corresponding one of the plurality of upper structures 154b.

Referring to FIG. 25, the individual semiconductor regions 159 are aligned at predetermined intervals in a longitudinal direction of the semiconductor composite apparatus 151. The interlayer dielectric film 155 (FIG. 27) is formed to cover the entire the semiconductor composite apparatus 151 except the individual semiconductor regions 159 and common potential pads 158 (FIG. 25).

Referring to FIGS. 26 and 27, the interlayer dielectric film 155 is formed with openings 155a in alignment with individual semiconductor elements 154, and openings 155b in alignment with the common potential pads 158. Referring to FIG. 25, the common potential pads 158 are arranged in the vicinity of the individual semiconductor regions 159, and connect the individual semiconductor regions 159 to the ground potential.

A transparent conductive film layer 156 is formed of, for example, indium/tin oxide (ITO) or zinc oxide (ZnO), and is formed on the interlayer dielectric film 155. As shown in FIG. 25, the transparent conductive film layer 156 covers all of the individual semiconductor regions 159 and common potential pads 158. The transparent conductive film layer 156 is in electrical contact with the upper structures 154b through the openings 158a, and in electrical contact with the common potential pads 158 through the openings 155b.

The transparent conductive film layer 156 serves as a "common electrode" common to the semiconductor elements 154 (i.e., LEDs) formed in the individual semiconductor regions 159. The individual conductive layers 152 serve as an individual electrode for driving the corresponding semiconductor elements 154. Because the transparent conductive film layer 156 is electrically connected to the common potential pads 158 of integrated circuits for driving the semiconductor elements 154, the voltage drop at the transparent conductive film layer 56 will not cause variation in potential of the common electrode even when the semiconductor elements 154 are energized individually.

The semiconductor composite apparatus 151 has been described with respect to a case where the transparent conductive film layer 156 is a single thin film, the transparent conductive film layer 156 may be divided into a plurality of sections, in which case the transparent conductive film layer 156 serves as an individual electrode connected to the output pad 157 of the integrated circuit while the individual conductive layers 152 serve as a common electrode connected to the common potential pads 158 of the integrated circuit.

The semiconductor composite apparatus 151 has been described with respect to a case where the individual conductive layers 152 are connected to the output pads 157 of the integrated circuits. If the semiconductor composite apparatus 151 do not include integrated circuits, the connection pads may be formed for connecting the individual conductive layers 152 to external drive circuits.

Because the transparent conductive layer 156 covers the light emitting surface of the semiconductor element 154 either partially or in its entirety, efficient utilization of light emitted from the LEDs can be ensured. Using the individual conductive layer 152 as an individual electrode allows current to spread over the entire surface of the LED, improving light emitting efficiency.

Because the individual conductive layers 152 (metal layer) are disposed under the semiconductor thin film layer 116, large steps do not exist under the individual conductive layers 152. This reduces the chance of cutting-off of wires even when the individual conductive layers 152 are made narrower, improving yield of the integrated circuit.

Tenth Embodiment

Figure 28:
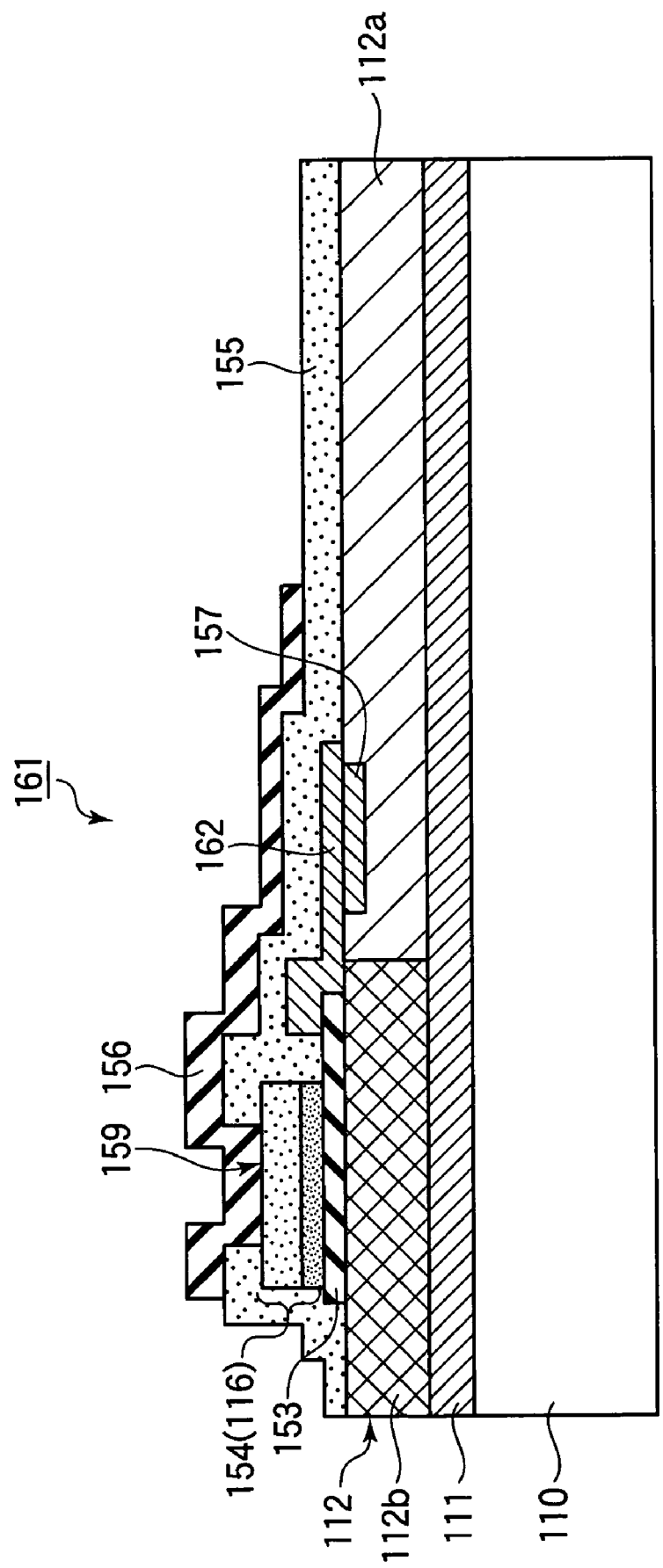
FIG. 28 is a cross sectional view illustrating a pertinent portion of a semiconductor composite apparatus according to a tenth embodiment.

FIG. 28 is a cross sectional view illustrating a pertinent portion of a semiconductor composite apparatus 161 according to a tenth embodiment. The cross sectional view in FIG. 28 corresponds to the cross sectional view taken along a line E-E of FIG. 25 in the ninth embodiment.

The semiconductor composite apparatus 161 differs from the semiconductor composite apparatus 151 according to the ninth embodiment in the configuration of a metal layer that connects a planarizing conductive layer 153 to an output pad 157. Elements similar to those of the ninth embodiment have been given the same reference numerals and their description is omitted.

Referring to FIG. 28, an individual conductive layer 162 of the semiconductor composite apparatus 161 partially covers the upper surface of the planarizing conductive film layer 153, and is in electrical contact with the upper surface. The individual conductive layer 162 is in electrical contact with the planarizing conductive film layer 153 and extends from the planarizing conductive film layer 153 to an output pad 157 of the integrated circuit and. The individual conductive layer 162 is a metal layer.

Because a metal layer is not formed immediately beneath the planarizing conductive film layer 153 but is formed on a part of the upper surface of the planarizing conductive film layer 153 and extend to another region, the metal layer is not damaged when the planarizing conductive film layer 153 is sintered at a higher temperature. This configuration offers a high-quality, low-resistance transparent conductive film layer.

Eleventh Embodiment

Figure 29:
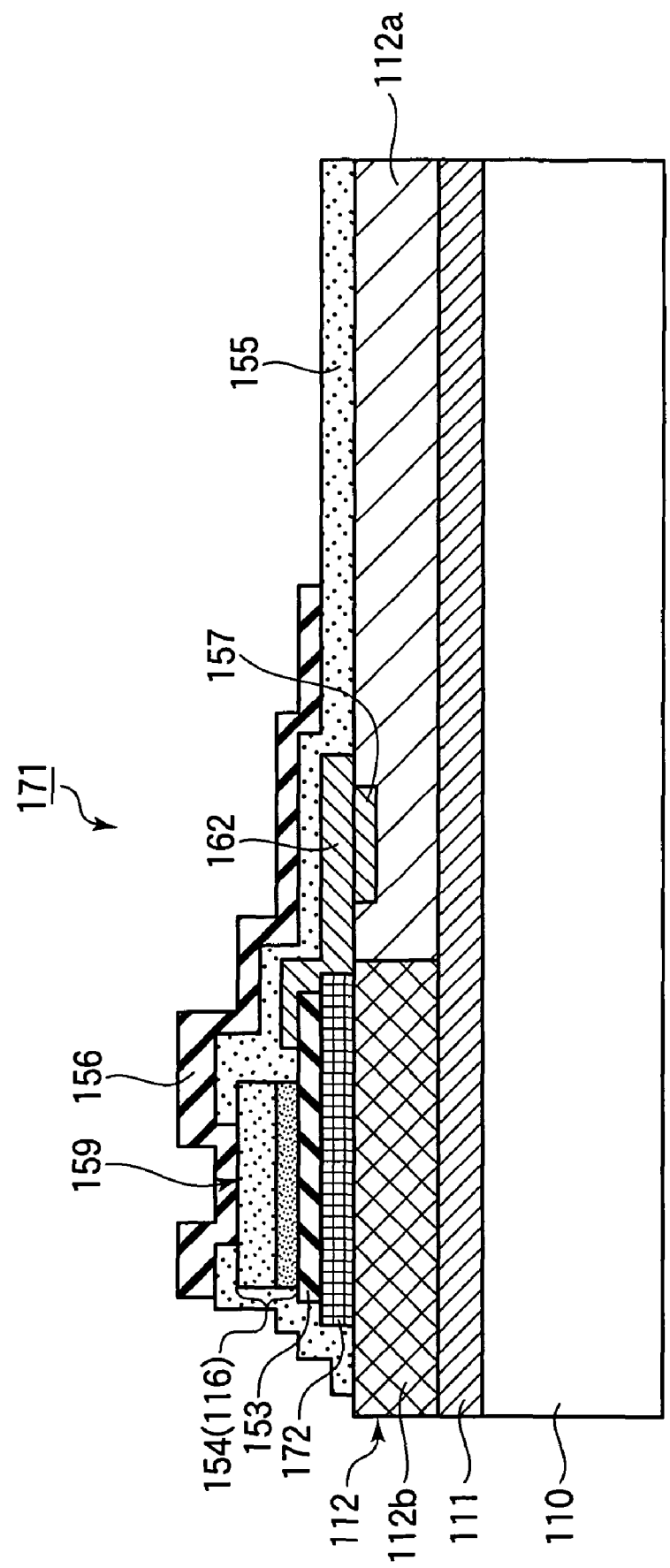
FIG. 29 is a cross sectional view of a pertinent portion of a semiconductor composite apparatus according to an eleventh embodiment.

FIG. 29 is a cross sectional view of a pertinent portion of a semiconductor composite apparatus 171. The cross sectional view in FIG. 29 corresponds to the cross sectional view taken along a line E-E of FIG. 25 in the ninth embodiment.

The semiconductor composite apparatus 171 differs from the semiconductor composite apparatus 161 according to the tenth embodiment in that a multi-layer reflection film layer 172 in the form of a dielectric film is formed between the planarizing conductive film layer 153 and a wiring region 112. Elements similar to those of the tenth embodiment have been given the same reference numerals and their description is omitted.

The multi-layer reflection film layer 172 is a reflection film in which dielectric films having different refraction indices are stacked. The multi-layer reflection film layer 172 may be an Si/SiO$_2$ film or an SiO$_2$/TiO$_2$ film. Alternatively, the multi-layer reflection film 172 may be a stacked structure of a low-refraction index material/high-refraction index material. The low refraction index materials include SiO$_2$, CaF$_2$, LiF, and MgF$_2$. The high-refraction index materials include TiO$_2$, CeO$_2$, CdS, and ZnS. The multi-layer reflection film layer 172 may be formed by sputtering. The planarizing conductive film layer 153 is formed on the multi-layer reflection film layer 172. The semiconductor thin film 116 is then bonded onto the planarizing conductive film layer 153.

A multi-layer reflection film layer formed of a dielectric film and a metal thin film may be provided in place of the multi-layer reflection film layer 172 that is formed only of a dielectric material. The multi-layer reflection film layer 172 may be applied to the sixth embodiment, if the semiconductor composite apparatus 101 is configured such that the conductive layer 114 extends from the upper surface of the planarizing conductive layer 115 and the multi-layer reflection film layer 172 is formed beneath the planarizing conductive layer 115 in the form of a transparent conductive film layer.

Because the multi-layer reflection film layer 172 is formed beneath the planarizing conductive film layer 153, the light reflected by the multi-layer reflection film layer 172 is also emitted through the light emitting surface of the LED, and the good conductive contact can be obtained on the back surface of the semiconductor thin film.

It is not a metal layer but the multi-layer reflection film layer 172 that is provided under the planarizing conductive film layer 153. Thus, the change in a reflection coefficient due to thermal treatment such as sinter is smaller in the eleventh embodiment where the multi-layer reflection film layer 172 is provided beneath the planarizing conductive film layer 153 than in the ninth embodiment where the metal layer is provided beneath the planarizing conductive film layer 153.

Twelfth Embodiment

Figure 30:
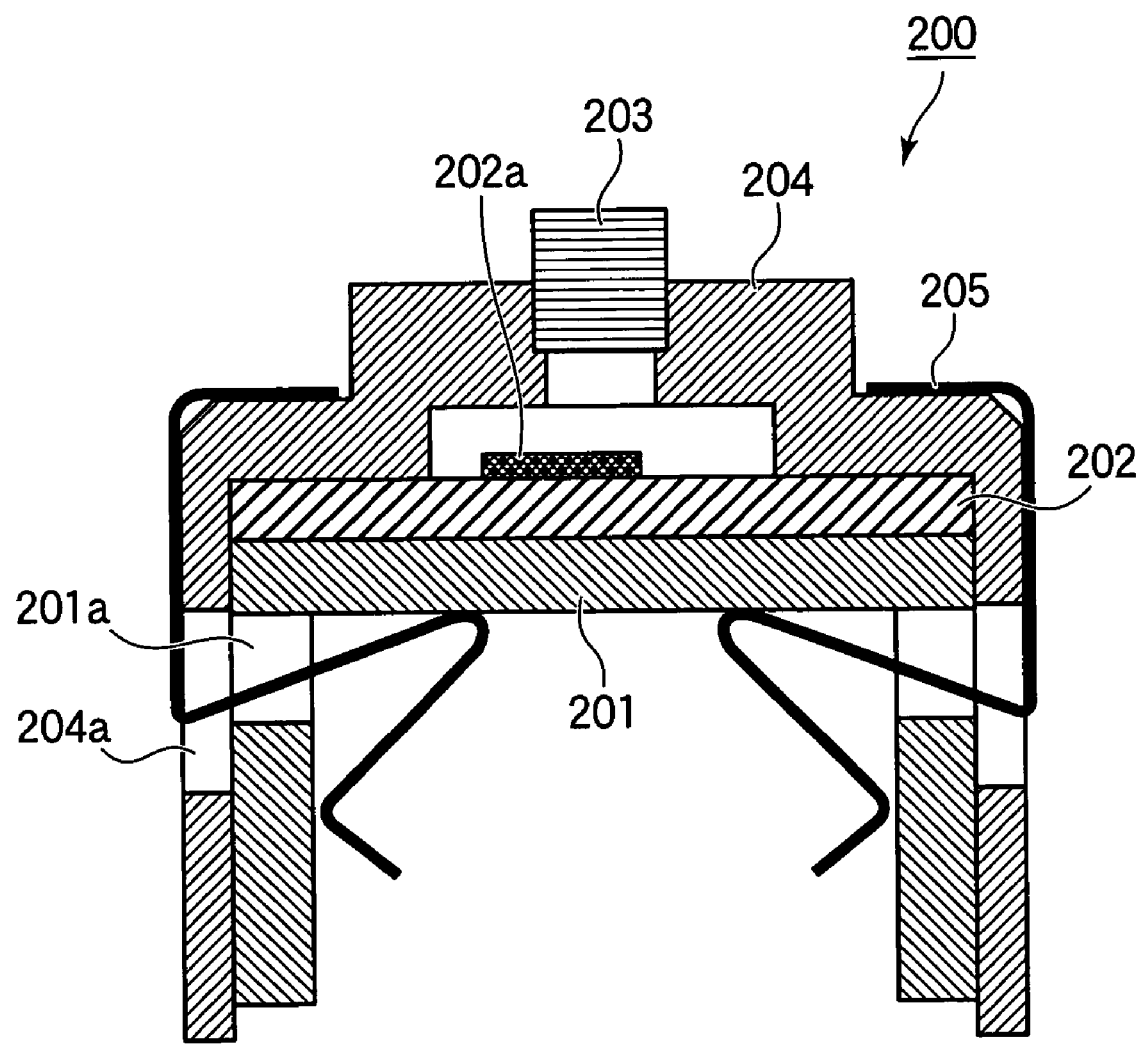
FIG. 30 illustrates an LED printhead according to the present invention.

FIG. 30 illustrates an LED printhead 200 according to the present invention.

Figure 31:
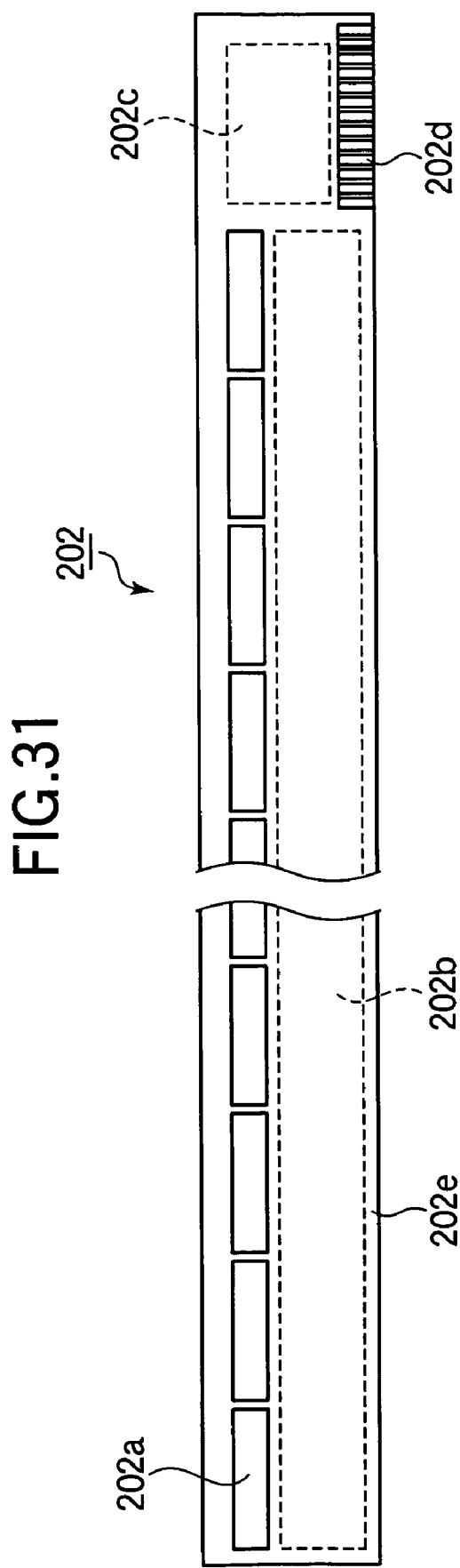
FIG. 31 is a top view illustrating an exemplary configuration of an LED unit.

Referring to FIG. 30, an LED unit 202 is mounted on a base member 201. The LED unit 202 includes any one of the semiconductor composite apparatuses according to any one of the first to eleventh embodiments. FIG. 31 is a top view illustrating an exemplary configuration of the LED unit 202. The semiconductor composite apparatus includes the light emitting regions and a driver circuit. A plurality of the semiconductor composite apparatuses is aligned in a longitudinal direction on a substrate 202e. The substrate 202e supports electronic component areas 202b and 202c where electronic components are arranged and interconnected by wires, and a connector 202d for supplying controls signals and electric power from an external circuit.

A rod lens array 203 is disposed over the light emitting regions of a light emitting unit 202a, and focuses the light emitted from the light emitting regions on an external member. The rod lens array 203 includes a plurality of column-like optical lenses aligned in a longitudinal direction of the light emitting unit 203a. The rod lens array 203 is held by a lens holder 204 in position.

The lens holder 204 is shaped to enclose the base member 201 and the LED unit 202. The base member 201, LED unit 202, and lens holder 204 are held in a sandwiched relation by means of dampers 205 that extend through openings 201a and 201b. The light emitted from the LED unit 202 transmits through the rod lens array 203, which in turn focuses the light onto the external member. The LED printhead 200 is used as an exposing unit in, for example, an electrophotographic printer and a copying machine.

Because the LED 202 employs any one of the semiconductor composite apparatuses according to the first to eleventh embodiments, a high-quality, reliable LED printhead can be obtained.

Thirteenth Embodiment

Figure 32:
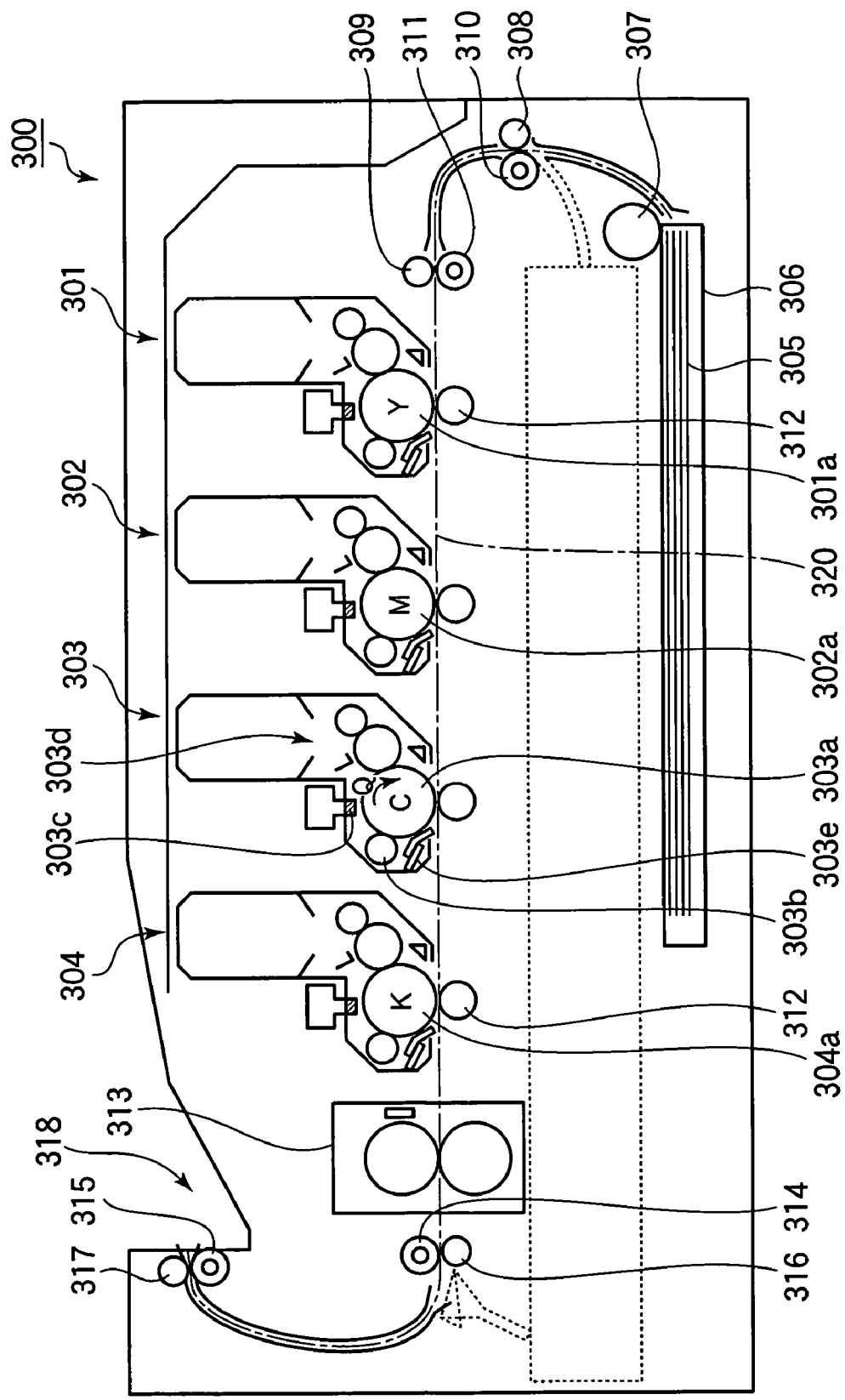
FIG. 32 illustrates a pertinent portion of an image forming apparatus according to the invention.
Figure 33:
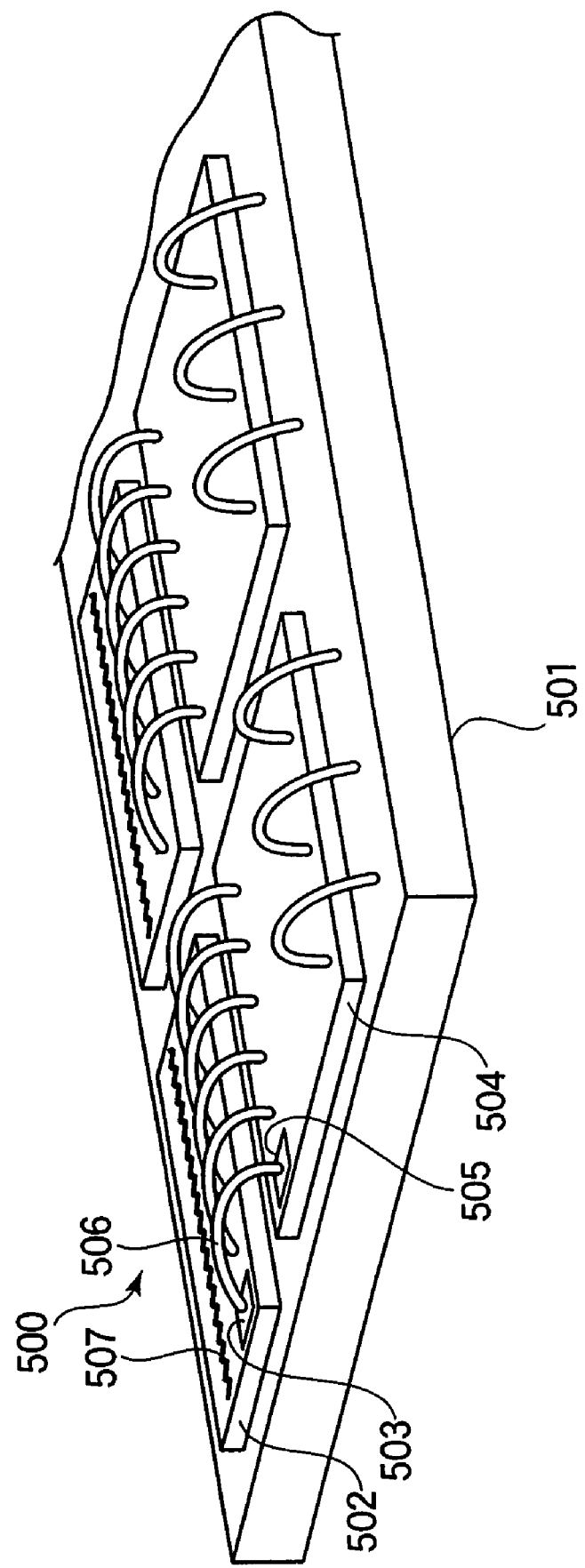
FIG. 33 is a perspective view illustrating a pertinent portion of a conventional LED printhead.
Figure 34:
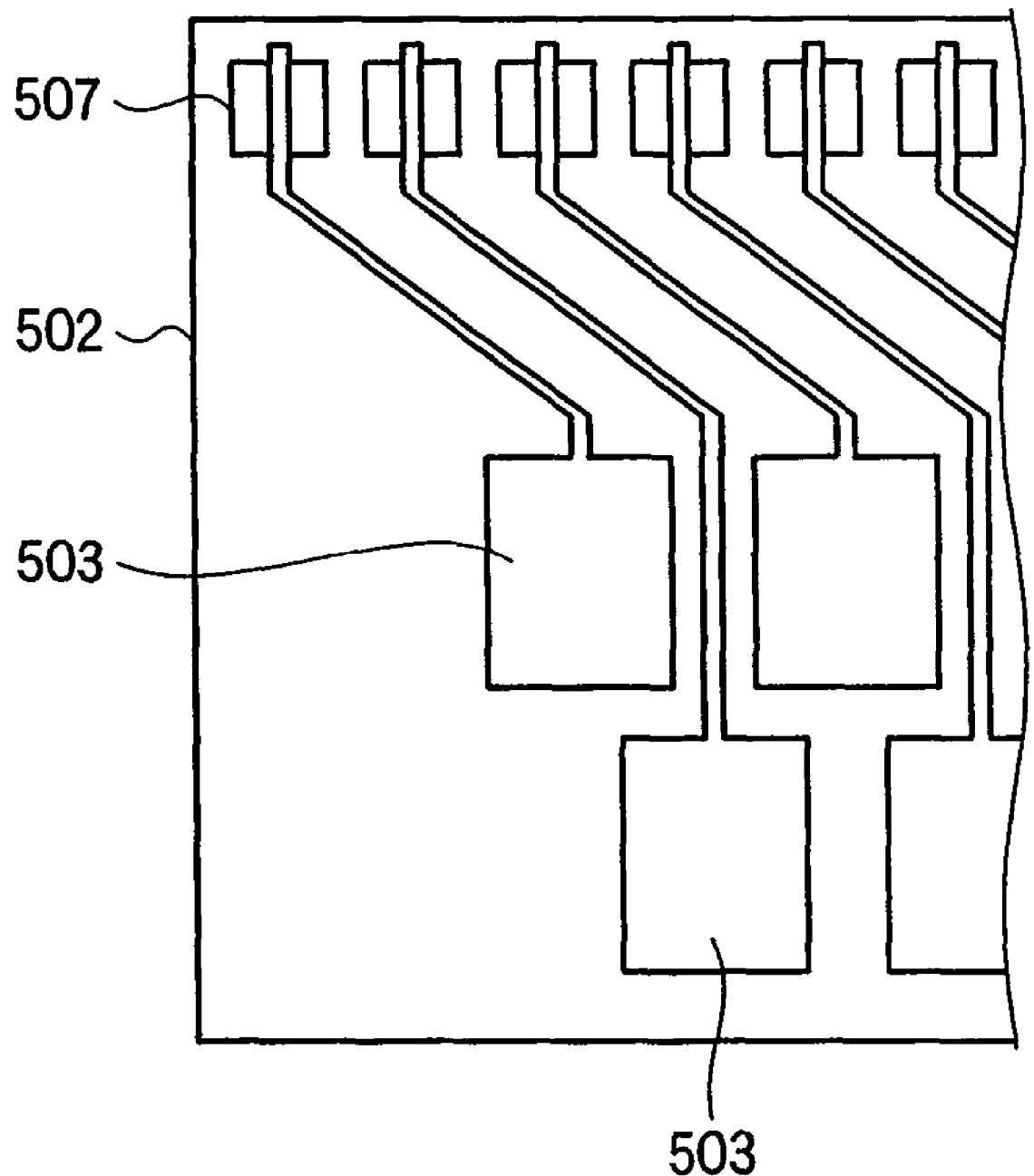
FIG. 34 is a fragmentary top view of an LED array chip of the conventional LED printhead.

FIG. 32 illustrates a pertinent portion of an image forming apparatus 300 according to the invention.

The image forming apparatus 300 includes process units 301-304 for forming yellow, magenta, cyan, and black images, respectively. The process units 301-304 are aligned along a transport path of a recording medium 305 from upstream to downstream with respect to a direction of travel of a recording medium. Each of the process units 301-304 may be substantially identical; for simplicity only the operation of the process unit 303 for forming cyan images will be described, it being understood that the other process units may work in a similar fashion.

The process unit 303 includes a photoconductive drum 303a that rotates in a direction shown by arrow Q. A charging unit 303b, exposing unit, 303c, developing unit 303d, and cleaning unit 303e are disposed around the photoconductive drum 303a in this order from upstream to downstream with respect to a direction of rotation of the photoconductive drum 303a. The charging unit 303b charges the surface of the photoconductive drum 303a. The exposing unit 303c selectively illuminates the charged surface of the photoconductive drum 303a to form an electrostatic latent image in accordance with print data. The exposing unit 303c is the LED printhead 200 described in the twelfth embodiment. The developing unit 303d deposits a cyan toner to the electrostatic latent image to develop the cyan image into a cyan toner image. The cleaning unit 303e removes the residual toner from the surface of the photoconductive drum 303a. Drums or rollers within these units are driven in rotation by a drive source and gears, not shown.

The image forming apparatus 300 further includes a paper cassette 306 attached at its lower portion. The paper cassette 306 holds a stack of recording medium 305 such as paper. A hopping roller 307 is disposed over the stack of recording medium 305 and feeds the top page into a transport path of the recording medium 305. A pinch roller 308 and a registration roller 309 are disposed in the transport path downstream of the hopping roller 307. A pinch roller 309 and a registration roller 311 are located downstream of the pinch roller 308 and registration roller 309. The pinch rollers 308 and 309 and registration rollers 310 and 311 are so interlocked that they are driven in rotation by a drive source and gears, now shown.

Transfer rollers 312 are disposed to face the corresponding photoconductive drum 303a of the process units 301-304. A voltage is applied to these transfer rollers 312 to create a potential difference between the transfer rollers and corresponding photoconductive drums, thereby transferring the toner images of the respective colors from the photoconductive drums 303a onto the recording medium 305 as the recording medium 305 passes through the process units 301-304 in sequence.

A fixing unit 313 includes a heat roller and a pressure roller. When the recording medium 305 passes through a transfer point defined between the heat roller and the pressure roller, the toner image is fixed into a permanent image. After fixing, discharge rollers 314 and 315 cooperate with pinch rollers 316 and 317 to hold the recording medium 305 in a sandwiched relation, and transport the recording medium 305 to a stacker 318. The discharge rollers 314 and 315 are driven in rotation by a drive source and gears, not shown.

The operation of the image forming apparatus will be described.

The hopping roller 307 feeds the top page of the stack of the recording medium 305 from the paper cassette 306 into the transport path. The registration rollers 310 and 311 and pinch rollers 308 and 309 cooperate with each other to transport the recording medium to the process unit 301. Then, the recording medium 305 advances through transfer points defined between the photoconductive drums and transfer rollers at the respective process units 301-304 in sequence. As the recording medium 305 passes through the transfer points, the toner images of the corresponding colors are transferred onto the recording medium 305 one over the other in registration. Then, the recording medium 305 enters the fixing unit 313 where the toner images of the respective colors are fixed into a permanent full color image under pressure and heat. The recording medium 305 is then transported by the pinch rollers 316 and 317 and discharge rollers 314 and 315 to the stacker 318.

Because the image forming apparatus 300 employs the LED printhead described in the twelfth embodiment, a high-quality, reliable image forming apparatus is implemented.

The sixth to eleventh embodiments have been described in terms of light emitting elements (LEDs) that are fabricated in a semiconductor thin film layer of the semiconductor composite apparatus. However, the present invention is not limited to LEDs but may be applied to light receiving elements or other semiconductor elements.

The invention being thus described, it will be obvious that the same may be varied in many ways. Such variations are not to be regarded as a departure from the spirit and scope of the invention, and all such modifications as would be obvious to one skilled in the art intended to be included within the scope of the following claims.

What is claimed is:

1. A semiconductor composite apparatus, comprising:
 a semiconductor substrate;
 an insulating planarizing layer formed on said substrate either directly or indirectly, said planarizing layer including a first surface facing said substrate and a second surface on the side of said planarizing layer remote from said substrate; and
 a semiconductor thin film having at least one pn junction, wherein the semiconductor thin film emits light primarily in a direction away from said substrate, and directly bonded on the second surface, said semiconductor thin film being formed of a material having a composition different from said planarizing layer.

2. The semiconductor composite apparatus according to claim 1, wherein said semiconductor thin film includes a light emitting element;
 wherein a reflection layer is formed under said planarizing layer, the reflection layer reflecting the light emitted from the light emitting element.

3. The semiconductor composite apparatus according to claim 2, wherein said planarizing layer is formed of a material transparent to light emitted from the light emitting element.

4. The semiconductor composite apparatus according to claim 2, wherein a thin film layer is formed between said planarizing layer and the reflection layer.

5. The semiconductor composite apparatus according to claim 4, wherein said thin film layer is a nitride.

6. The semiconductor composite apparatus according to claim 5, the nitride is either $Si_xN_y$ or $Si_xN_yO_z$.

7. The semiconductor composite apparatus according to claim 4, wherein said thin film layer is an oxide.

8. The semiconductor composite apparatus according to claim 7, wherein said thin film layer is either $SiO_x$ or $Al_2O_3$.

9. The semiconductor composite apparatus according to claim 2, wherein the reflection layer is a multi-layer reflection film formed of a dielectric thin film.

10. The semiconductor composite apparatus according to claim 2, wherein the reflection layer is formed of a metal material.

11. The semiconductor composite apparatus according to claim 10, wherein the reflection layer is either a single metal layer that contains at least one selected from the group of Ti, Au, Ge, Pt, and Ni, a multi-layered structure including layers formed of at least one element selected from the group consisting of Ti, Au, Ge, Pt, and Ni, a layer formed of more than one element selected from the group consisting of Ti, Au, Ge Pt, and Ni, or an alloy formed of more than one element selected from the group of Ti, Au, Ge Pt, and Ni.

12. The semiconductor composite apparatus according to claim 10, wherein said planarizing layer is formed of an organic material and the reflection layer is in contact with said planarizing layer, wherein an uppermost layer of the reflection layer is formed of an element selected from the group of Ti, Au, Cr, Ni, and Al.

13. The semiconductor composite apparatus according to claim 10, wherein a surface of the reflection layer in contact with said planarizing layer has a roughness not more than 15 nm.

14. The semiconductor composite apparatus according to claim 10, wherein the reflection layer contains an electrically conductive material.

15. The semiconductor composite apparatus according to claim 10, wherein the reflection layer is either a single metal layer formed of Ti, Au, Ge, Pt, or Ni, a stacked layer formed of a material that contains Ti, Au, Ge, Pt, or Ni, a composite layer formed of Ti, Au, Ge, Pt, or Ni, or an alloy of Ti, Au, Ge Pt, or Ni.

16. The semiconductor composite apparatus according to claim 2, wherein the reflection layer is a multi-layer reflection film formed of a dielectric thin film and a metal thin film.

17. The semiconductor composite apparatus according to claim 1, wherein the at least one pn junction forms a light emitting diode.

18. A semiconductor composite apparatus, comprising:
a semiconductor substrate;
an insulating planarizing layer formed on said substrate either directly or indirectly, said planarizing layer including a first surface facing said substrate and a second surface on a side of said planarizing layer remote from said substrate, said planarizing layer being formed of a homogenous material; and
a semiconductor thin film having an epitaxial structure directly bonded on the second surface, and wherein the semiconductor thin film emits light in a direction away from said substrate.

19. The semiconductor composite apparatus according to claim 18, wherein the homogenous material is selected from the group consisting of an organic compound, an oxide, and a nitride.

20. A semiconductor composite apparatus, comprising:
a semiconductor substrate;
an insulating planarizing layer formed on said substrate either directly or indirectly, said planarizing layer including a first surface facing said substrate and a second surface on a side of said planarizing layer remote from said substrate, said planarizing layer being formed of a material selected from the group consisting of an organic compound, an oxide, and a nitride; and
a semiconductor thin film having an epitaxial structure, and directly bonded on the second surface, and wherein the semiconductor thin film emits light in a direction away from said substrate.

21. The semiconductor composite apparatus according to claim 20, wherein the epitaxial structure forms a light emitting diode.

\* \* \* \* \*